(12) United States Patent
Suzuki

(10) Patent No.: US 8,371,219 B2
(45) Date of Patent: Feb. 12, 2013

(54) LITHOGRAPHIC PRINTING PLATE PRECURSOR AND PLATE MAKING METHOD THEREOF

(75) Inventor: Shota Suzuki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 557 days.

(21) Appl. No.: 12/712,882

(22) Filed: Feb. 25, 2010

(65) Prior Publication Data

US 2010/0212524 A1 Aug. 26, 2010

(30) Foreign Application Priority Data

Feb. 26, 2009 (JP) ................ P2009-044733
Sep. 1, 2009 (JP) ................ P2009-202014

(51) Int. Cl.
*G03F 7/038* (2006.01)
*G03C 1/00* (2006.01)

(52) U.S. Cl. ......... 101/467; 101/453; 101/451; 430/302
(58) Field of Classification Search ........................ None
See application file for complete search history.

(56) References Cited

U.S. PATENT DOCUMENTS

| 4,962,011 A * | 10/1990 | Aldag et al. ............... 430/281.1 |
| 2001/0018159 A1 | 8/2001 | Maemoto |
| 2002/0177074 A1 | 11/2002 | Hoshi et al. |
| 2003/0064318 A1 | 4/2003 | Huang et al. |
| 2003/0129522 A1 | 7/2003 | Oohashi et al. |
| 2007/0056457 A1 | 3/2007 | Iwai et al. |

FOREIGN PATENT DOCUMENTS

| EP | 1 457 837 A2 | 9/2004 |
| EP | 1 457 837 A3 | 9/2004 |
| EP | 1 754 597 A2 | 2/2007 |
| EP | 1 754 597 A3 | 2/2007 |
| EP | 1 754 614 A1 | 2/2007 |
| JP | 11-277927 A | 10/1999 |
| JP | 2000-335129 A | 12/2000 |
| JP | 2001-277740 A | 10/2001 |
| JP | 2001-277742 A | 10/2001 |
| JP | 2002-287334 A | 10/2002 |
| JP | 2003-191657 A | 7/2003 |
| JP | 2007-90850 A | 4/2007 |
| WO | WO 96/34316 | 10/1996 |

OTHER PUBLICATIONS

Extended European Search Report issued in EP 10 00 1942 on Jul. 5, 2012.

* cited by examiner

*Primary Examiner* — Joshua D Zimmerman
(74) *Attorney, Agent, or Firm* — Birch, Stewart, Kolasch & Birch, LLP.

(57) ABSTRACT

A lithographic printing plate precursor includes an image-recording layer and a support, and the image-recording layer contains: (A) at least one compound selected from compounds represented by the following formulae (1) and (2); and (B) an infrared absorbing agent:

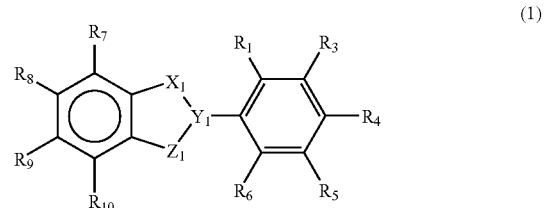

(1)

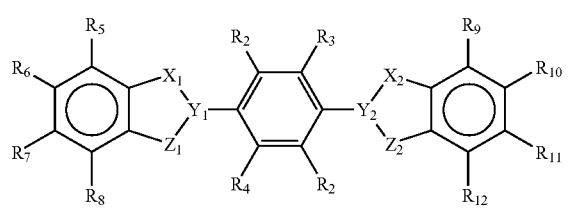

(2)

wherein $R_1$ and $R_2$ each represents $R_a$—$SO_3$—, $R_a$—$CO_2$— or $R_a$—$OCO_2$—, $R_a$ represents a monovalent organic group, $R_3$ to $R_{12}$ each represents a hydrogen atom or a monovalent substituent, or adjacent two of $R_3$ to $R_{12}$ may be combined with each other to form a ring, $X_1$, $Y_1$ and $Z_1$ and $X_2$, $Y_2$ and $Z_2$ each represents an atomic group necessary to form a thiazole ring, an oxazole ring, an imidazole ring, a triazole ring or a 3H-indole ring, provided that one nitrogen atom of the imidazole ring is connected to a hydrogen atom or a monovalent organic group.

10 Claims, No Drawings

LITHOGRAPHIC PRINTING PLATE PRECURSOR AND PLATE MAKING METHOD THEREOF

FIELD OF THE INVENTION

The present invention relates to a lithographic printing plate precursor and a plate making method using the same. More particularly, it relates to a lithographic printing plate precursor capable of undergoing a direct plate making by image exposure with laser and a plate making method comprising on-press development of the lithographic printing plate precursor.

BACKGROUND OF THE INVENTION

In general, a lithographic printing plate is composed of an oleophilic image area accepting ink and a hydrophilic non-image area accepting dampening water (fountain solution) in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as an "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing step.

Also, as a method of simple development, a method referred to as a "gum development" is practiced wherein the removal of the unnecessary area of image-recording layer is performed using not a conventional high alkaline developer but a finisher or gum solution of near-neutral pH.

In the simplification of plate making operation as described above, a system using a lithographic printing plate precursor capable of being handled in a bright room or under a yellow lump and a light source is preferable from the standpoint of workability. Thus, as the light source, a semiconductor laser emitting an infrared ray having a wavelength of 760 to 1,200 or a solid laser, for example, YAG laser, is used. An UV laser is also used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein is described in JP-A-2001-277740 (the term "JP-A" as used herein means an "unexamined published Japanese patent application") and JP-A-2001-277742. A lithographic printing plate precursor having provided on a support, an image-recording layer (photosensitive layer) containing an infrared absorbing agent, a radical polymerization initiator and a polymerizable compound is described in JP-A-2002-287334. A lithographic printing plate precursor capable of undergoing on-press development having provided on a support, an image-recording layer containing a polymerizable compound and a graft polymer having a polyethylene oxide chain in its side chain or a block polymer having a polyethylene oxide block is described in U.S. Patent Publication No. 2003/0064318.

In general, an operation (plate inspection) for inspection and discrimination of image formed on a printing plate is carried out in order to examine whether the image is recorded on the printing plate as intended, in advance of mounting the printing plate on a printing machine. In a conventional lithographic printing plate precursor subjected to a development processing step, since a color image is obtained by means of coloration of the image-recording layer it is ordinarily easily performed to confirm the image formed before the mounting the printing plate on a printing machine.

However, with respect to the lithographic printing plate precursor of the on-press development type or non-processing (non-development) type without accompanying the development processing, the image is not recognized on the printing plate in the step of mounting it on a printing machine, and thus the plate inspection can not be performed. In particular, it is important in the printing operation to determine whether a registry guide (register mark) which acts as a landmark for the registering in multicolor printing is recorded. Therefore, in the lithographic printing plate precursor of the on-press development type or non-processing (non-development) type, a means for confirming the image, that is, color formation or decoloration in the exposed area to form a so-called print-out image is required after the stage of exposure.

A lithographic printing plate precursor has been proposed wherein a compound capable of generating an acid, base or radical by means of light or heat and a compound capable of undergoing color change upon interaction with the acid, base or radical generated are used as a print-out agent (for example, see JP-A-11-277927). Also, it has been proposed to utilize color change of thermally decomposable compound as the print-out agent of a direct-drawing type lithographic printing plate precursor having a heat-sensitive layer (for example, see JP-A-2000-335129). Further, it has been proposed to use a thermally decomposable dye having a thermally decomposable temperature of 250° C. or below as the print-out agent (for example, see JP-A-2003-191657).

According to these proposals, although the color formation or decoloration occurs in the exposed area and the plate inspection property increases to some extent, it is still insufficient.

A system containing an infrared absorbing agent of cyanine dye having a 5-membered ring in its methine chain and a radical generator has good visibility and provides a print-out image at a level capable of performing plate inspection is described in JP-A-2007-90850. However, it is requested to provide a lithographic printing plate precursor having more excellent plate inspection property on the market.

SUMMARY OF THE INVENTION

Therefore, an object of the present invention is to provide a lithographic printing plate precursor capable of undergoing on-press development and capable of forming a color image of good plate inspection property by infrared laser exposure and a plate making method using the lithographic printing plate precursor.

(1) A lithographic printing plate precursor comprising an image-recording layer and a support, wherein the image-recording layer contains (A) at least any compound selected from compound represented by formula (1) shown below and compound represented by formula (2) shown below and (B) an infrared absorbing agent:

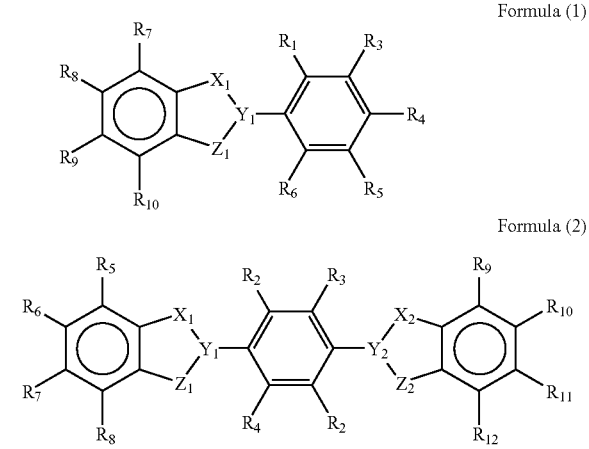

In formulae (1) and (2), $R_1$ and $R_2$ each represents $R_a$—$SO_3$—, $R_a$—$CO_2$— or $R_a$—$OCO_2$—, $R_a$ represents a monovalent organic group, $R_3$ to $R_{12}$ each represents a hydrogen atom or a monovalent substituent, or adjacent two of $R_3$ to $R_{12}$ may be combined with each other to form a ring, $X_1$, $Y_1$ and $Z_1$ and $X_2$, $Y_2$ and $Z_2$ each represents anatomic group necessary to form a triazole ring, oxazole ring, an imidazole ring, a triazole ring or a 3H-indole ring, provided that when $X_1$, $Y_1$ and $Z_1$ and/or $X_2$, $Y_2$ and $Z_2$ each represents an atomic group necessary to form an imidazole ring, one nitrogen atom of the imidazole ring is connected to a hydrogen atom or a monovalent organic group.

(2) The lithographic printing plate precursor as described in (1) above, wherein the image-recording layer contains (C) a photo-initiator.
(3) The lithographic printing plate precursor as described in (2) above, wherein (C) the photo-initiator is an iodonium compound, a sulfonium compound or an azinium compound.
(4) The lithographic printing plate precursor as described in any one of (1) to (3) above, wherein the image-recording layer contains (D) a radical polymerizable compound.
(5) The lithographic printing plate precursor as described in any one of (1) to (4) above, wherein the image-recording layer further contains (E) a hydrophobilizing precursor.
(6) The lithographic printing plate precursor as described in any one of (1) to (5) above, which further comprises a protective layer on the image-recording layer.
(7) The lithographic printing plate precursor as described in (6) above, wherein the protective layer contains an inorganic stratiform compound.
(8) The lithographic printing plate precursor as described in any one of (1) to (7) above, wherein the image-recording layer is an image-recording layer capable of forming an image after image exposure by supplying printing ink and dampening water on a printing machine to remove an unexposed area of the image-recording layer.
(9) A plate making method comprising exposing imagewise the lithographic printing plate precursor as described in (8) above and mounting on a printing machine or mounting the lithographic printing plate precursor as described in (8) above on a printing machine and exposing imagewise, and then conducting on-press development processing by supplying printing ink and dampening water.
(10) A plate making method comprising exposing imagewise the lithographic printing plate precursor as described in (8) above and mounting on a printing machine or mounting the lithographic printing plate precursor as described in (8) above on a printing machine and exposing imagewise to form color in the exposed area, and then conducting on-press development processing by supplying printing ink and dampening water.

According to the invention, a color image of good plate inspection property can be formed with infrared laser exposure by incorporating (A) at least any compound selected from compound represented by formula (1) shown below and compound represented by formula (2) shown below and (B) an infrared absorbing agent into an image-recording layer.

The color formation mechanism by the compound represented by formula (1) or (2) is not quite clear, but it is supposed to be as follows.

In the compound represented by formula (1) or (2), the group represented by $R_1$ or $R_2$ has a property of decomposing with heat or light stimulation. It is believed that in the image-recording layer, the compound is efficiently decomposed by infrared laser exposure to cause change in π conjugated system, thereby generating a highly colored compound.

According to the present invention, a lithographic printing plate precursor capable of undergoing on-press development and capable of forming a color image of good plate inspection property by infrared laser exposure and a plate making method using the lithographic printing plate precursor can be provided.

DETAILED DESCRIPTION OF THE INVENTION

Lithographic Printing Plate Precursor

The lithographic printing plate precursor according to the invention comprises over a support, an image-recording layer containing (A) at least any compound selected from compound represented by formula (1) shown below and compound represented by formula (2) shown below and (B) an infrared absorbing agent. According to the lithographic printing plate precursor, when it is exposed with infrared laser, a color image having good plate inspection property can be obtained.

It is preferred that the lithographic printing plate precursor according to the invention is capable of undergoing on-press development and has an image-recording layer capable of undergoing on-press development over a support. The lithographic printing plate precursor according to the invention may have a protective layer on the image-recording layer or an undercoat layer between the support and the image-recording layer in some cases.

The constituting element, component and the like of the lithographic printing plate precursor according to the invention will be described below.

((A) Compound Represented by Formula (1) and Compound Represented by Formula (2))

The image-recording layer according to the invention contains (A) at least either a compound represented by formula (1) shown below or a compound represented by formula (2) shown below.

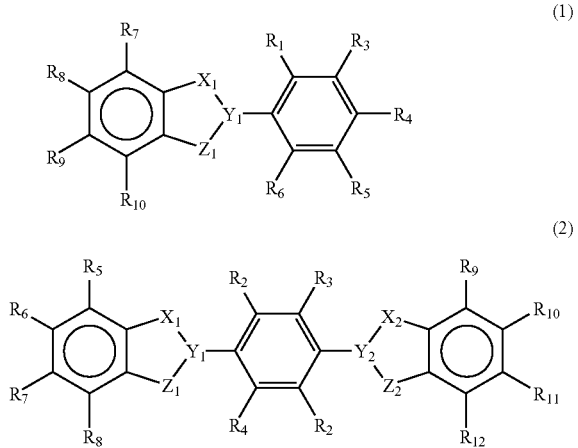

In formulae (1) and (2), $R_1$ and $R_2$ each represents $R_a$—$SO_3$—, $R_a$—$CO_2$— or $R_a$—$OCO_2$—, and preferably represents $R_a$—$SO_3$—.

$R_a$ represents a monovalent organic group. The monovalent organic group preferably includes an alkyl group, an alkenyl group, an alkynyl group, an aryl group and a heterocyclic group each of which may have a substituent, and preferably includes an alkyl group and an aryl group each of which may have a substituent. Examples of the substituent include those described for the substituent represented by any one of $R_3$ to $R_{12}$ below. Specific examples of the monovalent organic group represented by $R_a$ include a methyl group, an ethyl group, a trifluoromethyl group, a phenyl group and a 4-methylphenyl group, preferably includes a phenyl group and a 4-methylphenyl group, and particularly preferably includes a 4-methylphenyl group.

$R_3$ to $R_{12}$ in formulae (1) and (2) each represents a hydrogen atom or a monovalent substituent. Examples of the monovalent substituent include an amino group, an alkyl or aryl substituted amino group, an alkyl or aryl substituted carbonyl group, a hydroxy group, an alkyl or aryl substituted oxy group, a mercapto group, an alkyl or aryl substituted thio group, a silyl group, a nitro group, a cyano group, an alkyl group, an alkenyl group, an alkynyl group, an aryl group, a heterocyclic group, a sulfo group, an alkyl or aryl substituted sulfonyl group, a sulfonato group, an alkyl or aryl substituted sulfinyl group, a phosphono group, an alkyl or aryl substituted phosphono group, a phosphonato group, an alkyl or aryl substituted phosphonato group and a halogen atom. When it is possible to introduce, the monovalent substituent may further have a substituent. Of the monovalent substituents, an alkyl group, an alkyl or aryl substituted oxy group, a sulfo group and a sulfonato group are preferable, and an alkyl or aryl substituted oxy group (for example, a methoxy group), a sulfo group and a sulfonato group are particularly preferable. The alkyl group includes a straight-chain, branched or cyclic alkyl group having from 1 to 20 carbon atoms. Of the alkyl groups, a straight-chain alkyl group having from 1 to 12 carbon atoms, a branched alkyl group having from 3 to 12 carbon atoms and a cyclic alkyl group having from 5 to 12 carbon atoms are preferred. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group.

In the alkyl group which has a substituent, the alkyl moiety includes a divalent organic residue obtained by eliminating any one of hydrogen atoms on the alkyl group having from 1 to 20 carbon atoms described above. Also, the range of preferable number of carbon atoms is same as that of the alkyl group described above.

Specific preferable examples of the alkyl group which has a substituent include a chloromethyl group, a bromomethyl group, a 2-chloroethyl group, a trifluoromethyl group, a methoxymethyl group, a methoxycarbonylmethyl group, an isopropoxymethyl group, a butoxymethyl group, a sec-butoxybutyl group, a methoxyethoxyethyl group, an allyloxymethyl group, a phenoxymethyl group, an acetyloxymethyl group, a methylthiomethyl group, a tolylthiomethyl group, a pyridylmethyl group, a tetramethylpiperidinylmethyl group, an N-acetyltetramethylpiperidinylmethyl group, a trimethylsilylmethyl group, a methoxyethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Other preferable examples of the substituent include those described in Paragraph Nos. [0026] to [0049] of JP-A-2008-233685.

Also, adjacent two of $R_3$ to $R_{12}$ in formulae (1) and (2) may be combined with each other to form a ring. The ring formed is preferably a benzene ring. The ring formed may have a substituent. Examples of the substituent include those of the monovalent substituent for any one of $R_3$ to $R_{12}$ described above. Preferable examples thereof include an alkyl group, an alkoxy group, a sulfo group and a sulfonato group.

$X_1$, $Y_1$ and $Z_1$ and $X_2$, $Y_2$ and $Z_2$ each represents an atomic group necessary to form a triazole ring, oxazole ring, an imidazole ring, a triazole ring or a 3H-indole ring, provided that when $X_1$, $Y_1$ and $Z_1$ and/or $X_2$, $Y_2$ and $Z_2$ each represents an atomic group necessary to form an imidazole ring, one nitrogen atom of the imidazole ring is connected to a hydrogen atom or a monovalent organic group. The organic group is preferably an alkyl group which may have a substituent, and more preferably an alkyl group having from 1 to 5 carbon atoms. Specific examples thereof include a methyl group, an ethyl group, a propyl group, a pentyl group, a chloroethyl group, a methoxyethyl group and a hydroxyethyl group. As the 3H-indole ring, a 3,3-dialkyl-3H-indole ring is particularly preferable. Specifically, $X_1$ or $Z_1$ and/or $X_2$ or $Z_2$ is a dialkylmethylene group and a number of carbon atoms in the dialkylmethylene group is preferably 12 or less, more preferably 8 or less, and most preferably 4 or less.

From the standpoint of improvement in the plate inspection property, the compound represented by formula (2) is preferable because of adaptability of its colored compound to visibility, and among them, a compound represented by formula (3) shown below is particularly preferable.

(3)

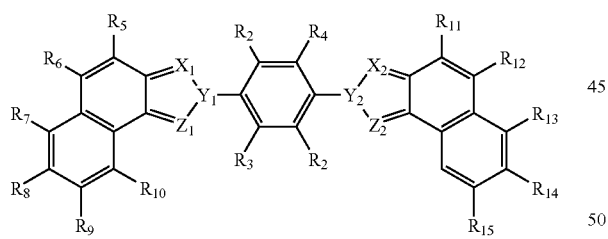

In formula (3), $R_2$ has the same meaning as $R_2$ in formula (2) and preferable ranges are also same. $R_3$ to $R_{15}$ each represents a hydrogen atom or a monovalent substituent. Examples of the monovalent substituent include the monovalent substituents for any one of $R_3$ to $R_{12}$ in formulae (1) and (2) and preferable ranges are also same. $X_1$, $Y_1$ and $Z_1$ and $X_2$, $Y_2$ and $Z_2$ have the same meanings as $X_1$, $Y_1$ and $Z_1$ and $X_2$, $Y_2$ and $Z_2$ in formula (2) respectively and preferable ranges are also same. It is more preferred that $X_1$ and $X_2$, $Y_1$ and $Y_2$ and $Z_1$ and $Z_2$ are same respectively.

Specific examples of the compound represented by formula (1) or (2) are set forth below, but the invention should not be construed as being limited thereto. In the formulae, Ts means a tosyl group.

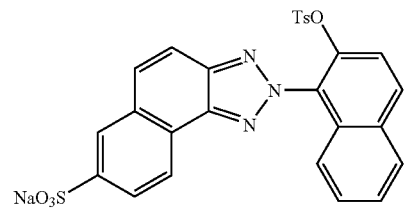

A-1

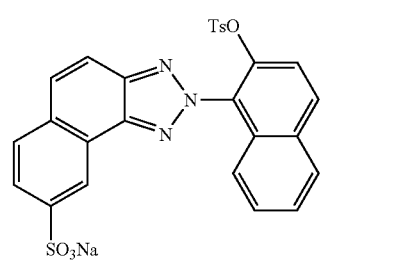

A-2

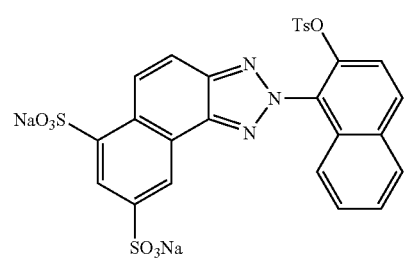

A-3

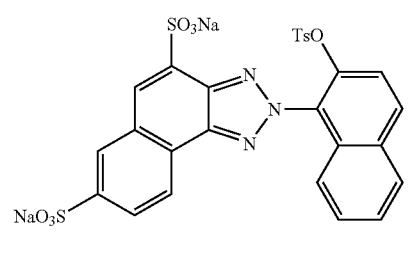

A-4

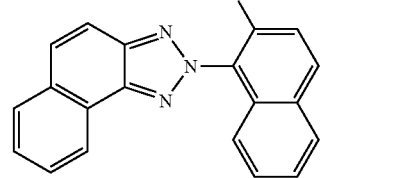

A-5

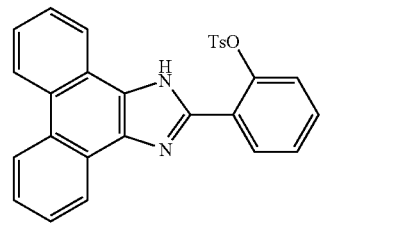

A-6

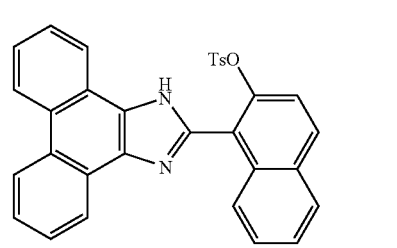

A-7

-continued
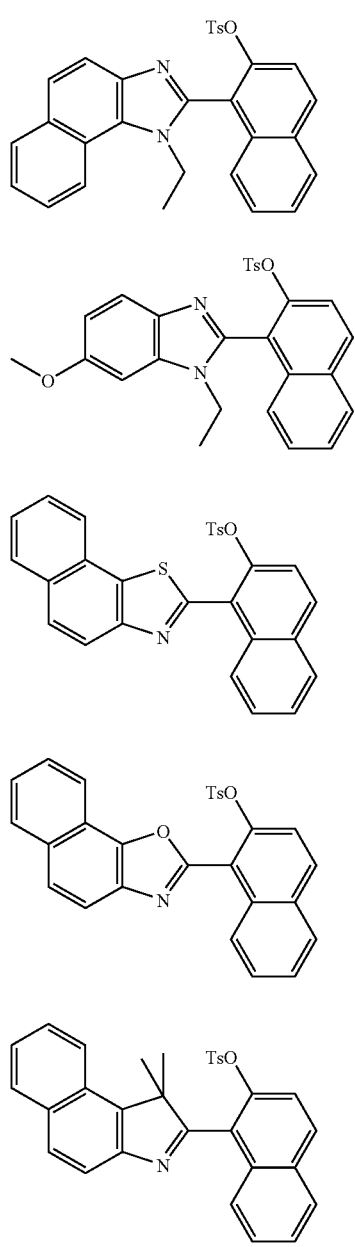
A-8
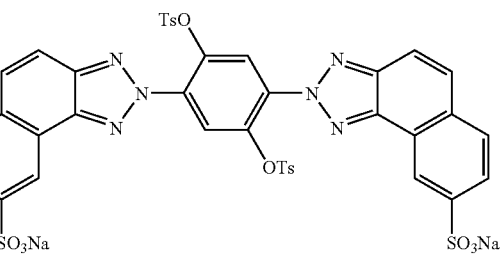
A-15
A-9
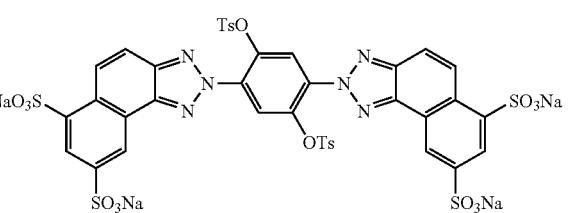
A-16
A-10
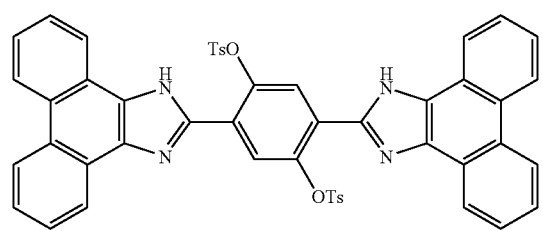
A-17
A-11
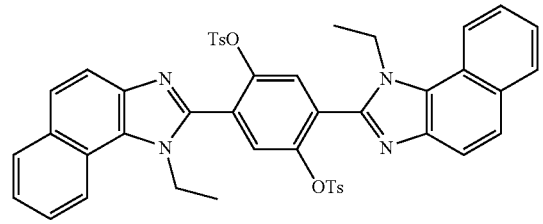
A-18
A-12
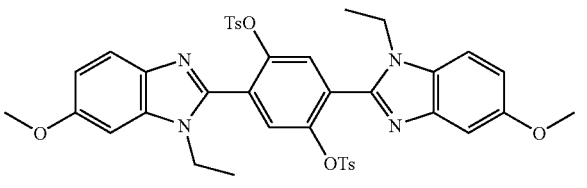
A-19
A-13
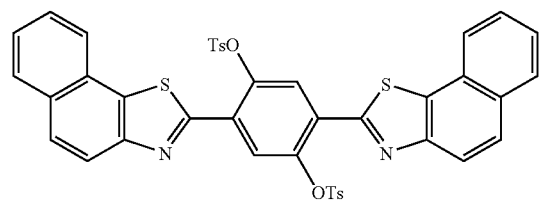
A-20
A-14

-continued
A-21
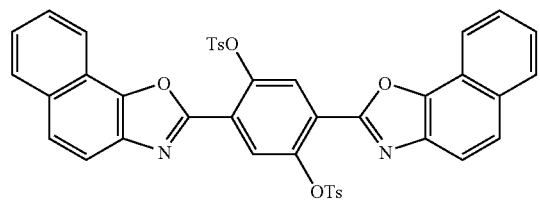
A-22
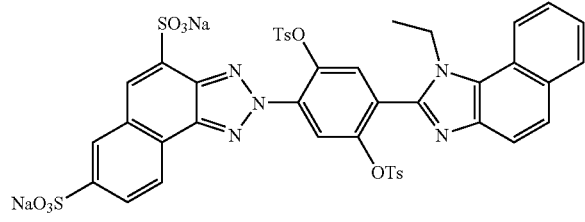
A-23
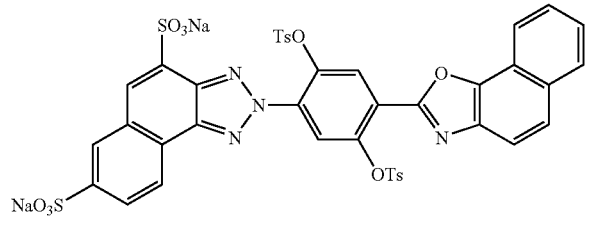
A-24
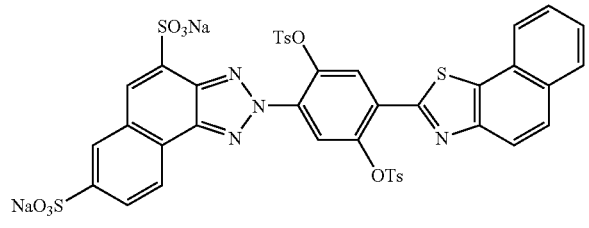
A-25
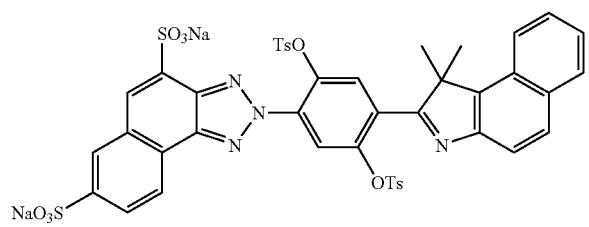
A-26
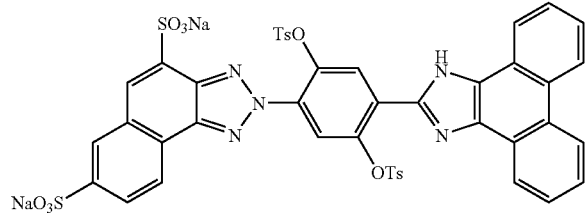
-continued
A-27
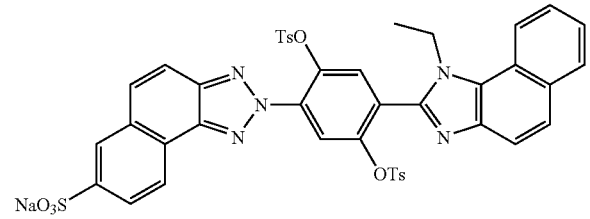
A-28
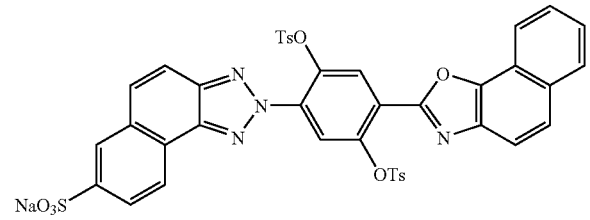
A-29
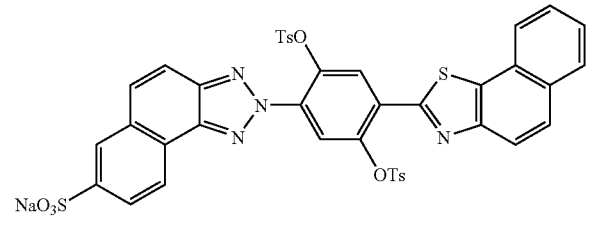
A-30
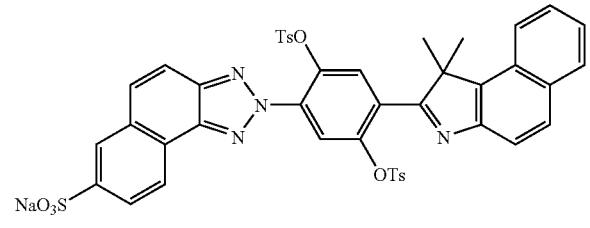
A-31
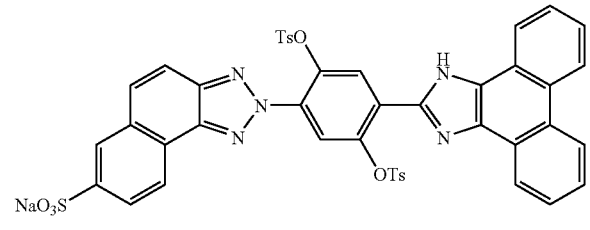
A-32
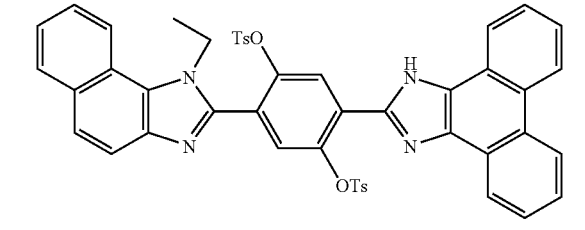

A-33
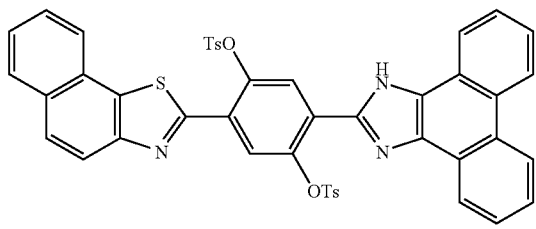
A-39
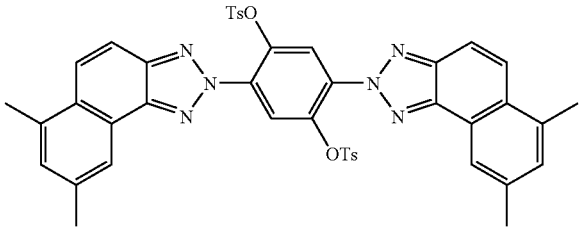
A-34
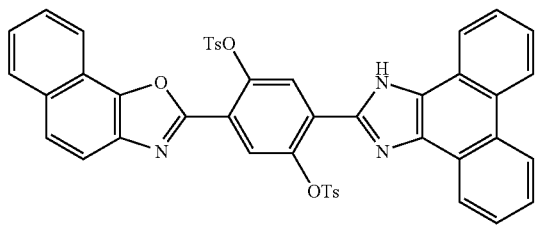
A-40
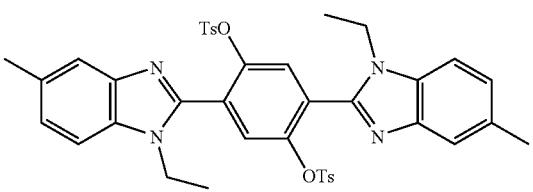
A-35
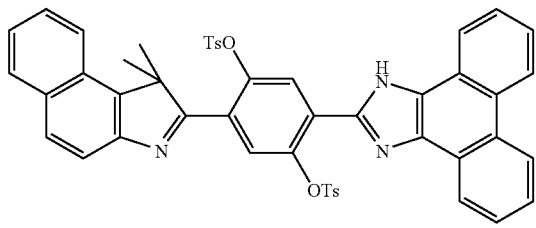
A-41
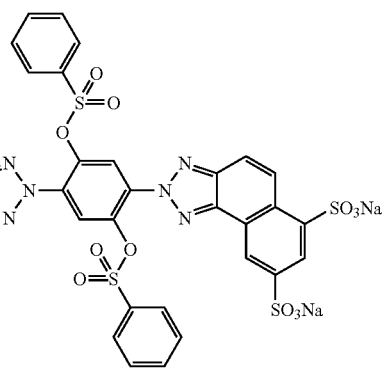
A-36
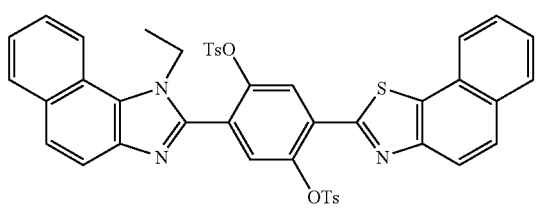
A-37
A-42
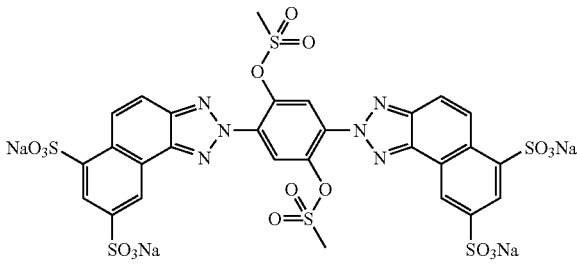
A-38
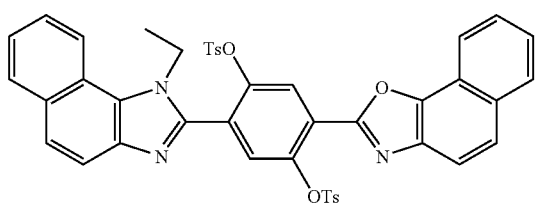
A-43
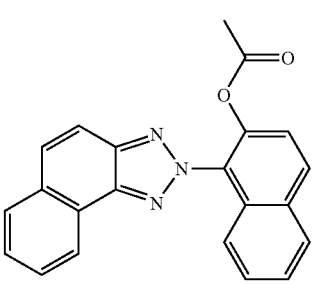

A-44
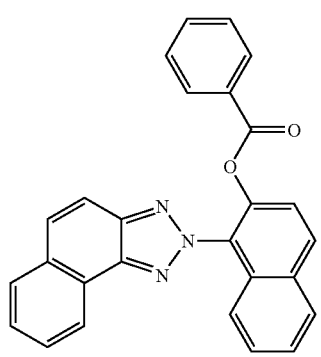
A-45
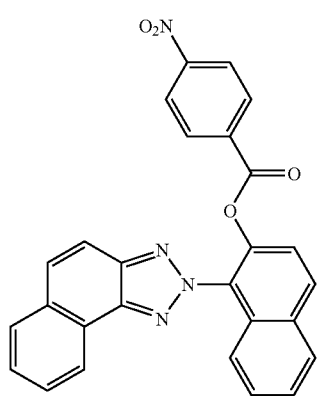
A-46
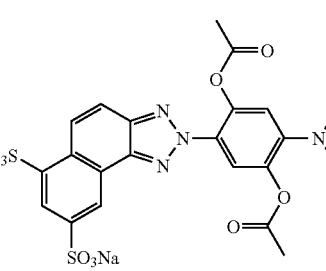
A-47
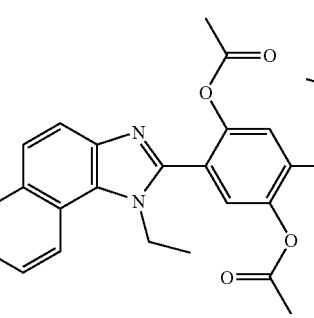
A-48
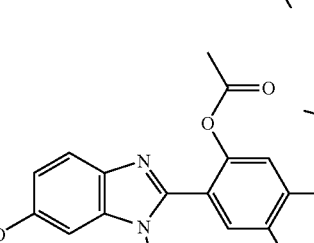
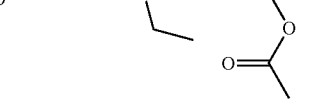
A-49
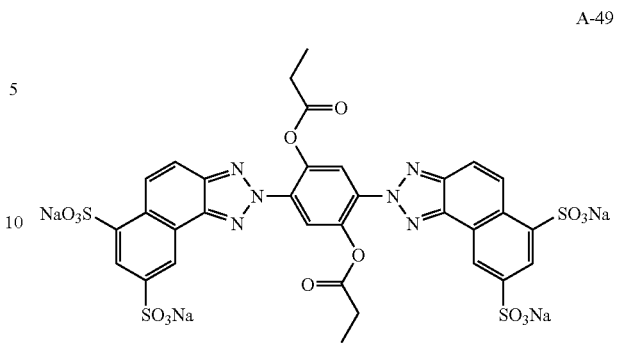
A-50
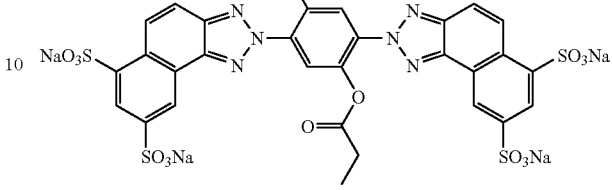
A-51
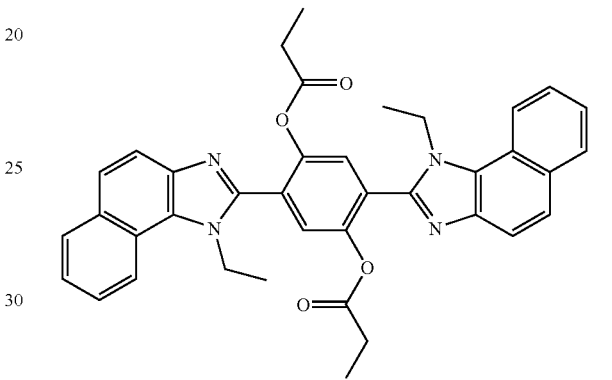
A-52
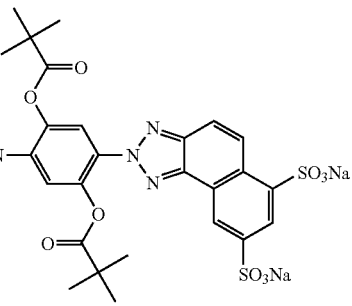

A-53
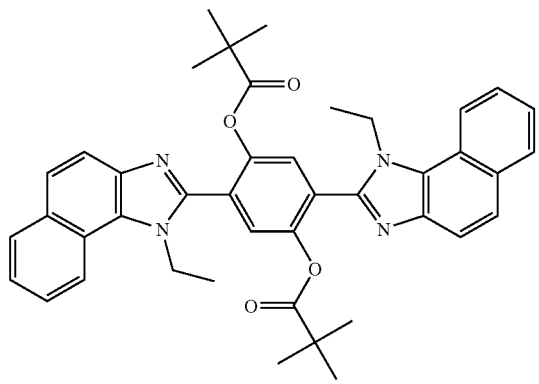
A-54
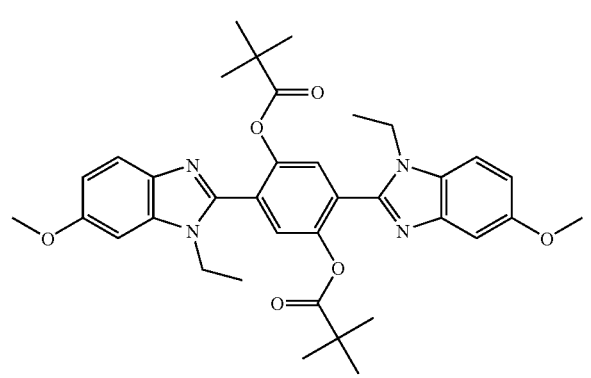
A-55
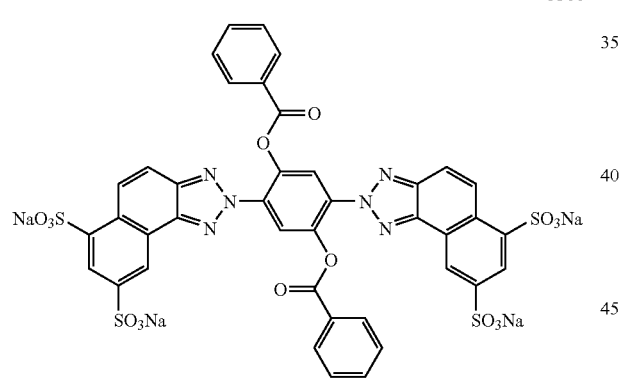
A-56
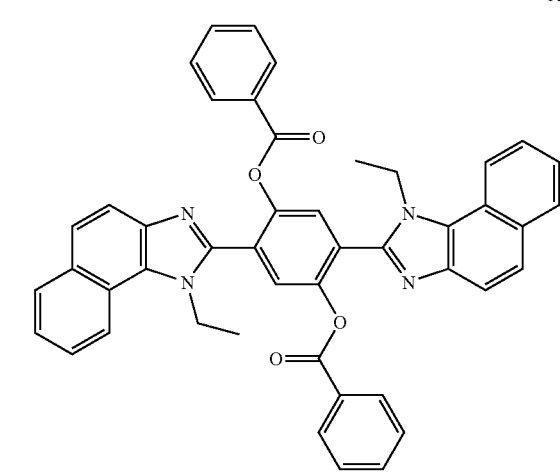
A-57
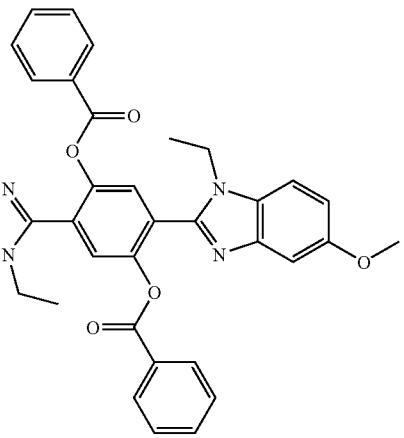
A-58
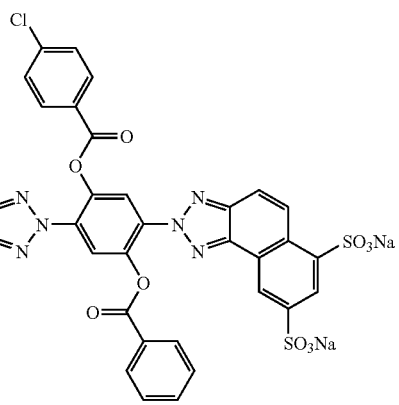
A-59
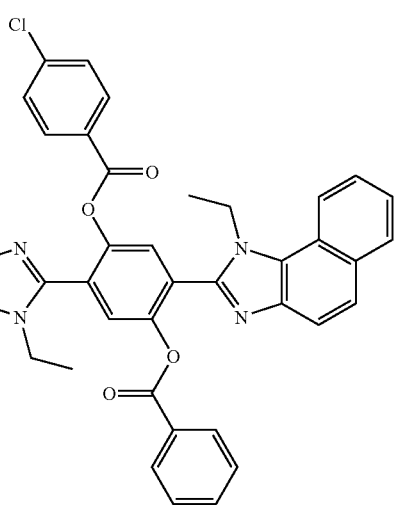

-continued
A-60
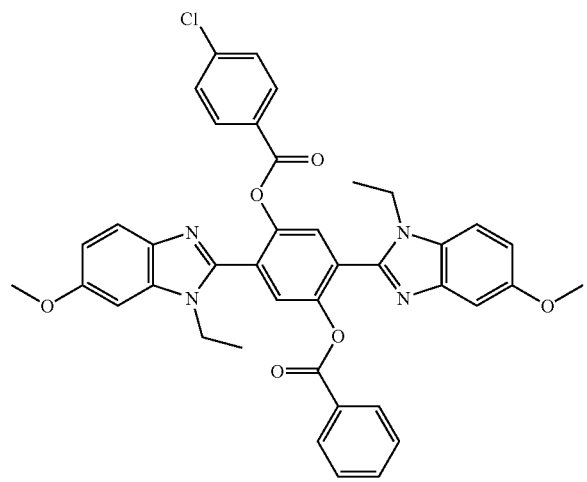
A-63
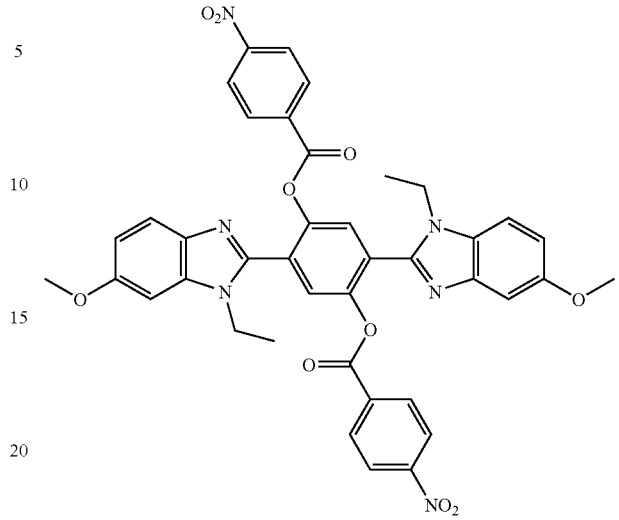
A-61
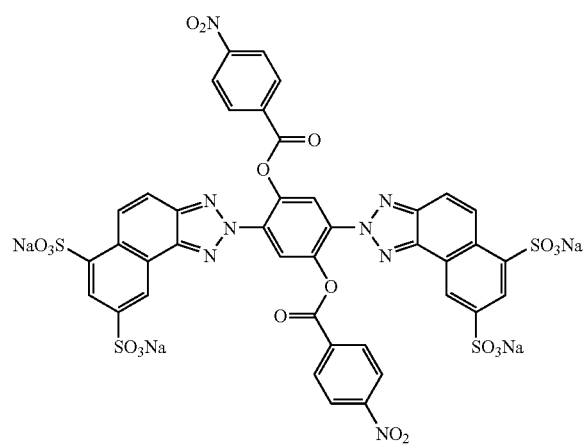
A-64
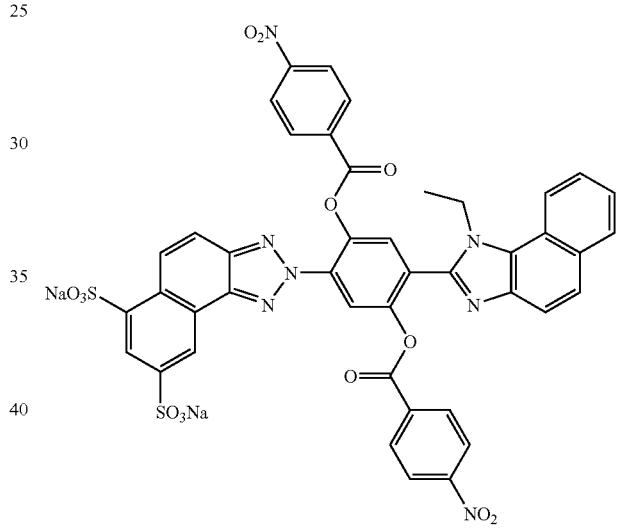
A-62
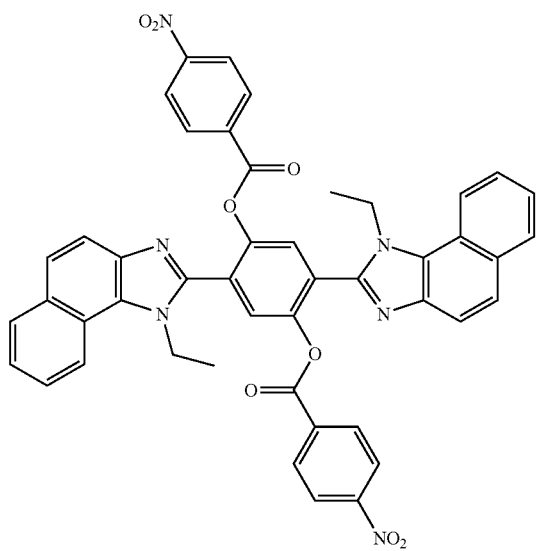
A-65
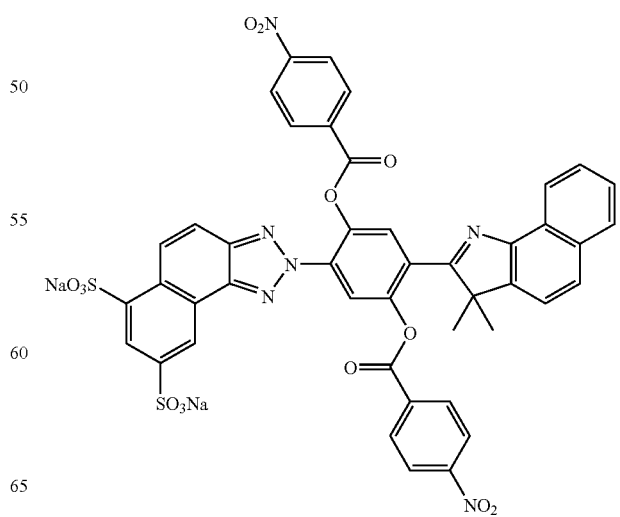

A-66

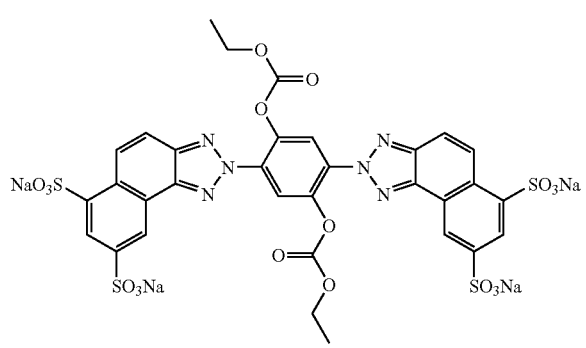

A-67

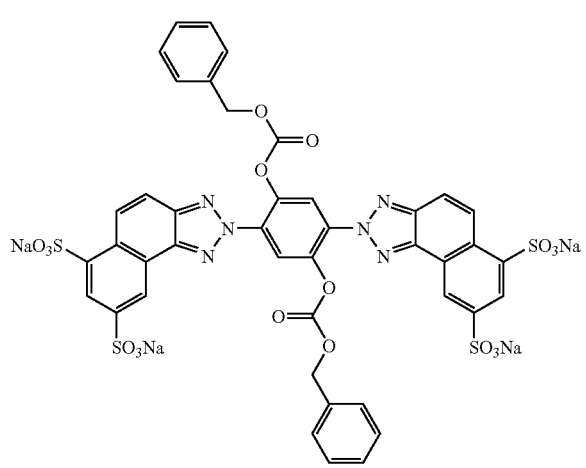

A-68

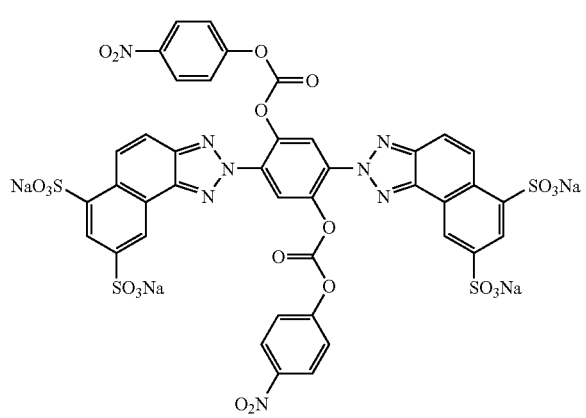

A-69

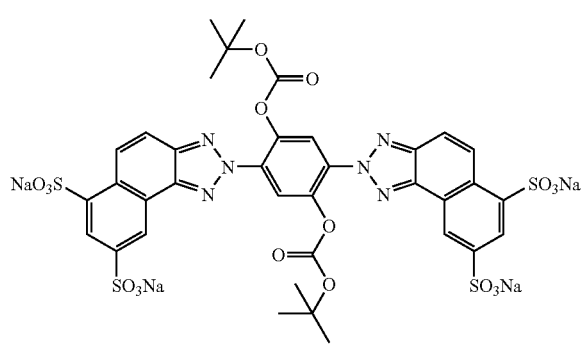

An amount of the compound (A) represented by formula (1) or (2) is preferably from 0.2 to 20% by weight, more preferably from 0.4 to 15% by weight, particularly preferably from 0.9 to 10% by weight, based on the total solid of the image-recording layer. In the range described above, a good colored image is obtained.

(Image-Recording Layer)

Now, the constituting components of the image-recording layer other than the compound (A) represented by formula (1) or (2) are described in detail below.

The image-recording layer for use in the invention is preferably an image-recording layer capable of undergoing on-press development. The representative image-forming mechanism enabling the on-press development included in the image-recording layer includes (1) an embodiment wherein (B) an infrared absorbing agent, (C) a photo-initiator and (D) a radical polymerizable compound are contained and an image area is cured utilizing a polymerization reaction and (2) an embodiment wherein (B) an infrared absorbing agent and (E) a hydrophobilizing precursor are contained and a hydrophobic region (image area) is formed utilizing heat fusion or heat reaction of the hydrophobilizing precursor. A mixture of these two embodiments may also used. For instance, the hydrophobilizing precursor (E) may be incorporated into the image-recording layer of polymerization type (1) or the radical polymerizable compound (D) and the like may be incorporated into the image-recording layer of hydrophobilizing precursor type (2). Among them, the embodiment of polymerization type including the infrared absorbing agent (B), photo-initiator (C) and radical polymerizable compound (D) is preferable.

Each component contained in the image-recording layer will be described in order below.

(B) Infrared Absorbing Agent

The infrared absorbing agent has a function of converting the infrared ray absorbed to heat and a function of being excited by the infrared ray to perform electron transfer and/or energy transfer to a photo-initiator described hereinafter. The infrared absorbing agent for use in the invention is a dye or pigment having an absorption maximum in a wavelength range of 760 to 1,200 nm.

As the infrared absorbing agent, compounds described in Paragraph Nos. [0058] to [0087] of JP-A-2008-195018 are used.

Of the dyes, cyanine dyes, squarylium dyes, pyrylium dyes and nickel thiolate complexes are particularly preferred. As the particularly preferable example of the dye, a cyanine dye represented by formula (a) shown below is exemplified.

Formula (a)

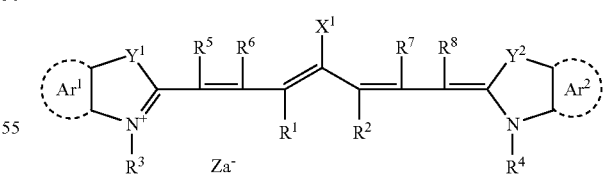

In formula (a), $X^1$ represents a hydrogen atom, a halogen atom, $-N(R^9)(R^{10})$, $X^2-L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms, which may have a substituent or a hydrogen atom, or $R^9$ and $R^{10}$ may be combined with each other to form a ring. Among them, a phenyl group is preferable. $X^2$ represents an oxygen atom or a sulfur atom, $L^1$ represents a hydrocarbon group having from 1 to 12 carbon atoms, an aromatic ring group containing a hetero atom or a hydrocarbon group having from 1 to 12 carbon atoms and containing a hetero atom. The hetero atom used herein indicates a nitrogen atom, a sulfur atom, an oxygen atom, a halogen atom and a selenium atom. In the group shown below, $Xa^-$ has the same meaning as $Za^-$ defined hereinafter, and $R^a$ represents a hydrogen atom or a substituent selected from an alkyl group, an aryl group, a substituted or unsubstituted amino group and a halogen atom.

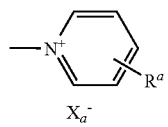

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. It is also preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring group and a naphthalene ring group. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. In view of the preservation stability of a coating solution for image-recording layer, preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion.

Specific examples of the cyanine dye represented by formula (a), which can be preferably used in the invention, include those described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638.

The content of the infrared absorbing agent in the image-recording layer according to the invention is preferably from 0.1 to 10.0% by weight, more preferably from 0.5 to 5.0% by weight, based on the total solid content of the image-recording layer.

(C) Photo-Initiator

The photo-initiator (C) for use in the invention is a compound which initiates or accelerates polymerization of the radical polymerizable compound (D). The photo initiator for use in the invention is preferably a radical polymerization initiator and includes, for example, known thermal polymerization initiators, compounds containing a bond having small bond dissociation energy and photopolymerization initiators.

The radical polymerization initiators in the invention include, for example, (a) organic halides, (b) carbonyl compounds, (c) azo compounds, (d) organic peroxides, (e) metallocene compounds, (f) azido compounds, (g) hexaarylbiimidazole compounds, (h) organic borate compounds, (i) disulfone compounds, (j) oxime ester compounds and (k) onium salt compounds.

As the organic halides (a), compounds described in Paragraph Nos. [0022] to [0023] of JP-A-2008-195018 are preferable.

As the carbonyl compounds (b), compounds described in Paragraph No. [0024] of JP-A-2008-195018 are preferable.

As the azo compounds (c), for example, azo compounds described in JP-A-8-108621 are used.

As the organic peroxides (d), for example, compounds described in Paragraph No. [0025] of JP-A-2008-195018 are preferable.

As the metallocene compounds (e), for example, compounds described in Paragraph No. [0026] of JP-A-2008-195018 are preferable.

As the azido compounds (f), compound, for example, 2,6-bis(4-azidobenzylidene)-4-methylcyclohexanone is exemplified.

As the hexaarylbiimidazole compounds (g), for example, compounds described in Paragraph No. [0027] of JP-A-2008-195018 are preferable.

As the organic borate compounds (h), for example, compounds described in Paragraph No. [0028] of JP-A-2008-195018 are preferable.

As the disulfone compounds (i), for example, compounds described in JP-A-61-166544 and JP-A-2002-328465 are exemplified.

As the oxime ester compounds (j), for example, compounds described in Paragraph Nos. [0028] to [0030] of JP-A-2008-195018 are preferable.

As the onium salt compounds (k), onium salts, for example, diazonium salts described in S. I. Schlesinger, *Photogr. Sci. Eng.*, 18, 387 (1974) and T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Publication No. 2008/0311520 and JP-A-2-150848, sulfonium salts described in European Patents 370,693, 390,214, 233,567, 297,443 and 297,442, U.S. Pat. Nos. 4,933,377, 4,760,013, 4,734,444 and 2,833,827, German Patents 2,904,626, 3,604,580 and 3,604,581 and JP-A-2008-195018, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), arsonium salts described in C. S. Wen et al., *Teh, Proc. Conf. Rad. Curing ASIA*, p. 478, Tokyo, October (1988), and azinium salts described in JP-A-2008-195018 are exemplified.

Of the radical polymerization initiators, the onium salts, particularly, the iodonium salts, sulfonium salts and azinium salts are preferable. Specific examples of these compounds are set forth below, but the invention should not be construed as being limited thereto.

Examples of the iodonium salt include diphenyliodonium hexafluorophosphate, 4-methoxyphenyl-4-(2-methylpropyl) phenyliodonium hexafluorophosphate, 4-(2-methylpropyl) phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodoniumtetraphenylborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate and tris(4-chlorophenyl)sulfonium 3,5-bis(methoxycarbonyl)benzenesulfonate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The photo-initiator can be added to the image-recording layer preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(D) Radical Polymerizable Compound

The radical polymerizable compound (D) for use in the invention is an addition-polymerizable compound having at least one ethylenically unsaturated double bond, and it is preferably selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a (co)polymer thereof, or a mixture thereof.

Specific examples of the radical polymerizable compound include compounds described in Paragraph Nos. [0089] to [0098] of JP-A-2008-195018. Among them, esters of aliphatic polyhydric alcohol compound with an unsaturated carboxylic acid (for example, acrylic acid, methacrylic acid, itaconic acid, crotonic acid, isocrotonic acid or maleic acid) are preferably exemplified. Other preferable radical polymerizable compound includes polymerizable compounds containing an isocyanuric acid structure described in JP-A-2005-329708.

Among them, isocyanuric acid ethylene oxide-modified acrylates, for example, tris(acryloyloxyethyl) isocyanurate or bis(acryloyloxyethyl)hydroxyethyl isocyanurate are particularly preferable.

The radical polymerizable compound (D) is preferably used in an amount from 5 to 80% by weight, more preferably from 25 to 75% by weight, based on the total solid content of the image-recording layer.

(E) Hydrophobilizing Precursor

According to the invention, a hydrophobilizing precursor can be used in order to improve the on-press development property. The hydrophobilizing precursor for use in the invention is a fine particle capable of converting the image-recording layer to be hydrophobic when heat is applied. The fine particle is preferably at least one fine particle selected from hydrophobic thermoplastic polymer fine particle, thermo-reactive polymer fine particle, microcapsule having a hydrophobic compound encapsulated and microgel (crosslinked polymer fine particle). Among them, polymer fine particle having a polymerizable group and microgel are preferable.

As the hydrophobic thermoplastic polymer fine particle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene and polymethyl methacrylate are more preferable.

The average particle size of the hydrophobic thermoplastic polymer fine particle for use in the invention is preferably from 0.01 to 2.0 μm.

The thermo-reactive polymer fine particle for use in the invention includes a polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, a functional group performing any reaction can be used as long as a chemical bond is formed. For instance, an ethylenically unsaturated group (for example, an acryloyl group, a methacryloyl group, a vinyl group or an allyl group) performing a radical polymerization reaction, a cationic polymerizable group (for example, a vinyl group or a vinyloxy group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsules. It is a more preferable embodiment of the image-recording layer containing microcapsules that hydrophobic constituting components are encapsulated in microcapsules and hydrophilic components are present outside the microcapsules.

The image-recording layer according to the invention is an embodiment containing a crosslinked resin particle, that is, a microgel. The microgel can contain a part of the constituting components of the image-recording layer inside and/or on the surface thereof. Particularly, an embodiment of a reactive microgel containing the radical polymerizable compound (D) on the surface thereof is preferable in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time-lapse stability can be achieved.

The content of the hydrophobilizing precursor is preferably in a range of 5 to 90% by weight in terms of solid content concentration of the image-recording layer.

(F) Other Components

The image-recording layer according to the invention may further contain other components, if desired.

(1) Binder Polymer

In the image-recording layer according to the invention, a binder polymer can be used for the purpose of improving film strength of the image-recording layer. The binder polymer which can be used in the invention can be selected from those heretofore known without restriction, and polymers having a film-forming property are preferable. Among them, acrylic resins, polyvinyl acetal resins and polyurethane resins are preferable.

As the binder polymer preferable for the invention, a polymer having a crosslinkable functional group for improving film strength of the image area in its main chain or side chain, preferably in its side chain, as described in JP-A-2008-195018 is exemplified. Due to the crosslinkable functional group, crosslinkage is formed between the polymer molecules to facilitate curing.

As the crosslinkable functional group, an ethylenically unsaturated group, for example, a (meth)acryl group, a vinyl group or an allyl group or an epoxy group is preferable. The crosslinkable functional group can be introduced into the polymer by a polymer reaction or copolymerization. For instance, a reaction between an acrylic polymer or polyurethane having a carboxyl group in its side chain and glycidyl methacrylate or a reaction between a polymer having an epoxy group and a carboxylic acid containing an ethylenically unsaturated group, for example, methacrylic acid can be utilized.

The content of the crosslinkable group in the binder polymer is preferably from 0.1 to 10.0 mmol, more preferably from 1.0 to 7.0 mmol, most preferably from 2.0 to 5.5 mmol, based on 1 g of the binder polymer.

It is also preferred that the binder polymer for use in the invention further contains a hydrophilic group. The hydrophilic group contributes to impart the on-press development property to the image-recording layer. In particular, coexistence of the crosslinkable group and the hydrophilic group makes it possible to maintain good balance between printing durability and developing property.

The hydrophilic group includes, for example, a hydroxy group, a carboxyl group, an alkylene oxide structure, an amino group, an ammonium group, an amido group, a sulfo group and a phosphoric acid group. Among them, an alkylene oxide structure containing from 1 to 9 alkylene oxide units having 2 or 3 carbon atoms is preferable. In order to introduce a hydrophilic group into the binder polymer, a monomer having the hydrophilic group is copolymerized.

In order to control the ink-receptive property, an oleophilic group, for example, an alkyl group, an aryl group, an aralkyl group or an alkenyl group may be introduced into the binder polymer according to the invention. Specifically, an oleophilic group-containing monomer, for example, an alkyl methacrylate is copolymerized.

Specific examples of the binder polymer for use in the invention are set forth below, but the invention should not be construed as being limited thereto.

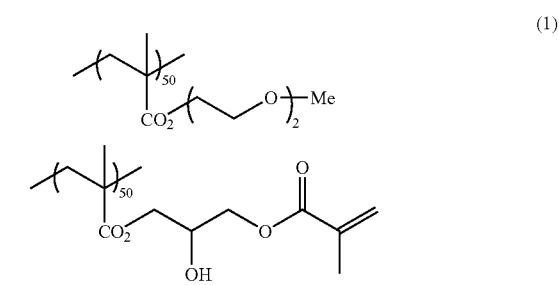

(1)

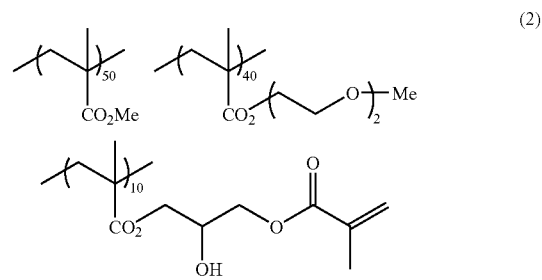

(2)

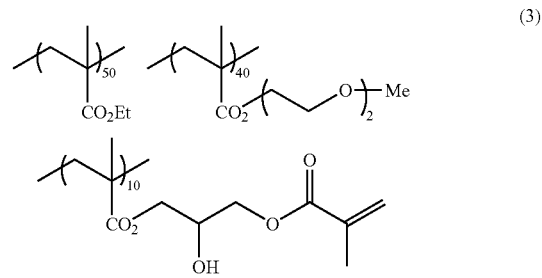

(3)

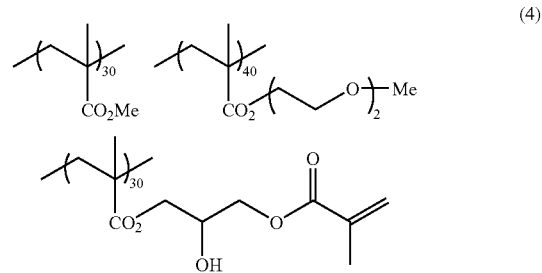

(4)

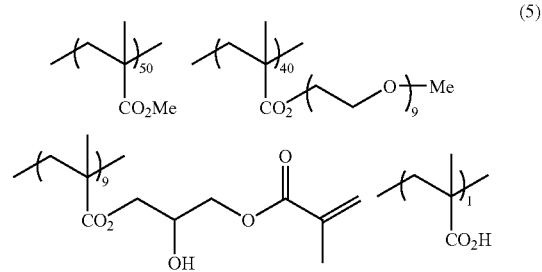

(5)

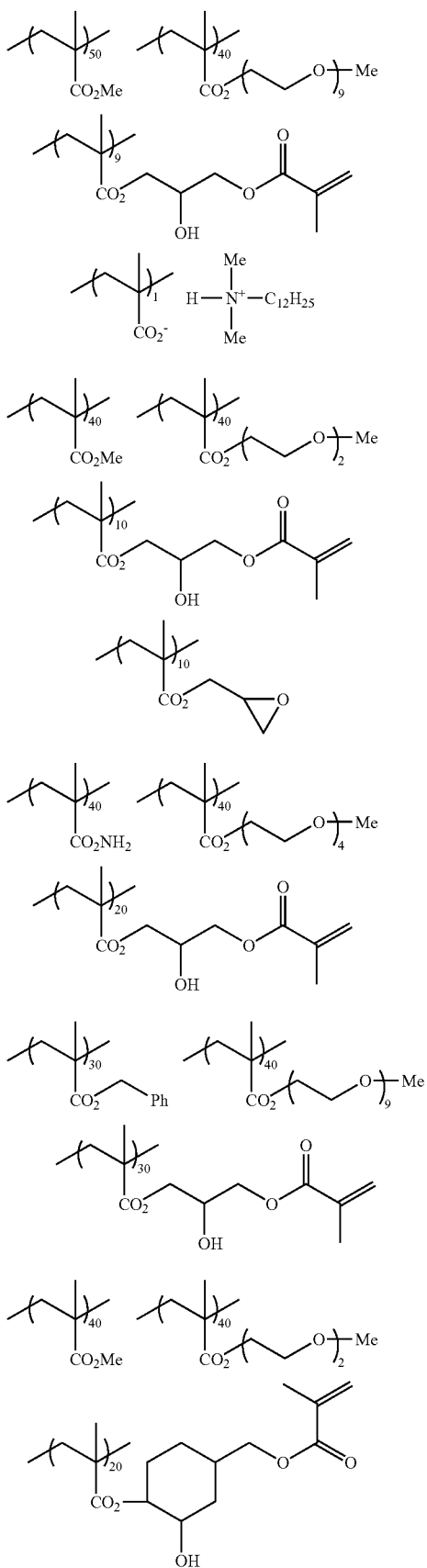

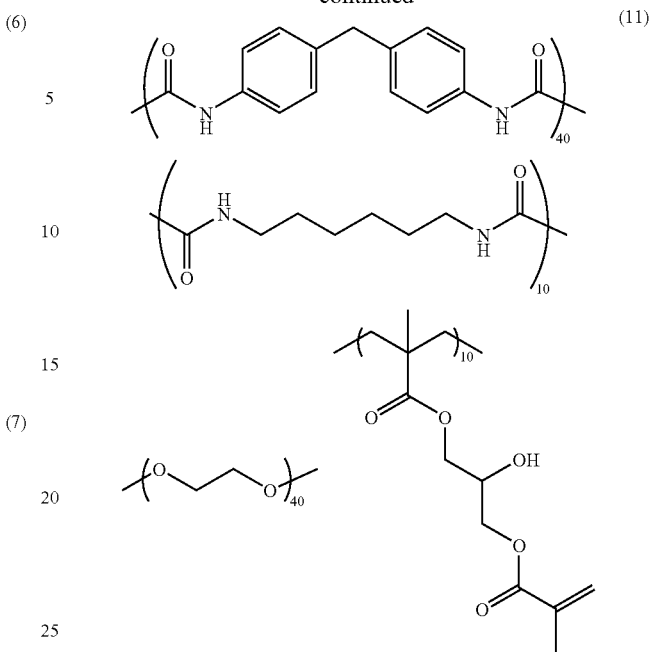

The weight average molecular weight (Mw) of the binder polymer according to the invention is preferably 2,000 or more, more preferably 5,000 or more, and still more preferably from 10,000 to 300,000.

According to the invention, a hydrophilic polymer, for example, polyacrylic acid or polyvinyl alcohol described in JP-A-2008-195018 may be used, if desired. Further, an oleophilic binder polymer is used together with a hydrophilic binder polymer.

The content of the binder polymer is ordinarily from 5 to 90% by weight, preferably from 5 to 80% by weight, more preferably from 10 to 70% by weight, based on the total solid content of the image-recording layer.

(2) Hydrophilic Low Molecular Weight Compound

The image-recording layer according to the invention may contain a hydrophilic low molecular weight compound in order to improve the on-press development property without accompanying the decrease in the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine, pentaerythritol or tris(2-hydroxyethyl) isocyanurate, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

According to the invention, it is preferred that at least one compound selected from a polyol compound, an organic sulfate compound, an organic sulfonate compound and a betaine compound is incorporated.

Specific examples of the organic sulfonate compound include an alkylsulfonate, for example, sodium n-butylsulfonate, sodium n-hexylsulfonate, sodium 2-ethylhexylsulfonate, sodium cyclohexylsulfonate or sodium n-octylsulfonate; an alkylsulfonate containing an ethylene oxide chain, for example, sodium 5,8,11-trioxapentadecane-1-sulfate, sodium 5,8,11-trioxaheptadecane-1-sulfate, sodium 13-ethyl-5,8,11-trioxaheptadecane-1-sulfate or sodium 5,8,11,14-tetraoxatetracosane-1-sulfate; and an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphtyldisulfonate or trisodium 1,3,6-naphtyltrisulfonate. The salt may also be potassium salt or lithium salt.

The organic sulfate compound includes a sulfate of alkyl, alkenyl, alkynyl, aryl or heterocyclic monoether of polyethylene oxide. The number of unit of ethylene oxide is preferably from 1 to 4. The salt is preferably a sodium salt, a potassium salt or a lithium salt.

As the betaine compound, a compound wherein a number of carbon atoms included in a hydrocarbon substituent on the nitrogen atom is from 1 to 5 is preferable. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-porpanesulfonate and 3-(1-pyridinio)-1-porpanesulfonate.

Since the hydrophilic low molecular weight compound has a small structure of hydrophobic portion and almost no surface active function, degradations of the hydrophobicity and film strength in the image area due to penetration of dampening water into the exposed area (image area) of the image-recording layer are prevented and thus, the ink receptive-property and printing durability of the image-recording layer can be preferably maintained.

The amount of the hydrophilic low molecular weight compound added to the image-recording layer is preferably from 0.5 to 20% by weight, more preferably from 1 to 10% by weight, still more preferably from 2 to 8% by weight, based on the total solid content of the image-recording layer. In the range described above, good on-press development property and good printing durability are achieved.

The hydrophilic low molecular weight compounds may be used individually or as a mixture of two or more thereof.

(3) Oil-Sensitizing Agent

In order to improve the ink-receptive property, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into a protective layer described hereinafter, the oil-sensitizing agent functions as a surface covering agent of the inorganic stratiform compound and prevents deterioration of the ink-receptive property during printing due to the inorganic stratiform compound.

As preferable examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio) heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate and benzyldimethyldodecylammonium hexafluorophosphate.

The ammonium group-containing polymer may be any polymer containing an ammonium group in its structure and is preferably a polymer containing from 5 to 80% by mole of (meth)acrylate having an ammonium group in its side chain as a copolymerization component.

As to the ammonium group-containing polymer, its reduced specific viscosity value (unit: cSt/g/ml) determined according to the measuring method described below is preferably from 5 to 120, more preferably from 10 to 110, particularly preferably from 15 to 100.

<Measuring Method of Reduced Specific Viscosity>

In a 20 ml measuring flask was weighed 3.33 g of a 30% polymer solution (1 g as a solid content) and the measuring flask was filled up to the gauge line with N-methylpyrrolidone. The resulting solution was put into an Ubbelohde viscometer (viscometer constant: 0.010 cSt/s) and a period for running down of the solution at 30° C. was measured. The viscosity was determined in a conventional manner according to the following calculating formula:

Kinetic viscosity=Viscometer constant×Period for liquid to pass through a capillary (sec)

Specific examples of the ammonium group-containing polymer are set forth below.

(1) 2-(Trimethylammonio) ethyl methacrylate p-toluenesulfonate/3,6-dioxaheptyl methacrylate copolymer (molar ratio: 10/90)

(2) 2-(Trimethylammonio) ethyl methacrylate hexafluorophosphate/3,6-dioxaheptyl methacrylate copolymer (molar ratio: 20/80)

(3) 2-(Ethyldimethylammonio) ethyl methacrylate p-toluenesulfonate/hexyl methacrylate copolymer (molar ratio: 30/70)

(4) 2-(Trimethylammonio) ethyl methacrylate hexafluorophosphate/2-ethylhexyl methacrylate copolymer (molar ratio: 20/80)

(5) 2-(Trimethylammonio) ethyl methacrylate methylsulfate/hexyl methacrylate copolymer (molar ratio: 40/60)

(6) 2-(Butyldimethylammonio) ethyl methacrylate hexafluorophosphate/3,6-dioxaheptyl methacrylate copolymer (molar ratio: 20/80)

(7) 2-(Butyldimethylammonio)ethyl acrylate hexafluorophosphate/3,6-dioxaheptyl methacrylate copolymer (molar ratio: 20/80)

(8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80)

(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5)

The content of the oil-sensitizing agent is preferably from 0.01 to 30.0% by weight, more preferably from 0.1 to 15.0% by weight, still more preferably from 1 to 5% by weight, based on the total solid content of the image-recording layer.

(4) Other Components

Other components, for example, a surfactant, a coloring agent, a print-out agent, a polymerization inhibitor, a higher fatty acid derivative, a plasticizer, a fine inorganic particle, an inorganic stratiform compound, a co-sensitizer or a chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

(G) Formation of Image-Recording Layer

The image-recording layer according to the invention is formed by dispersing or dissolving each of the necessary constituting components described above in a solvent to prepare a coating solution and coating the solution on a support by a known method, for example, bar coater coating and drying as described in Paragraph Nos. [0142] to [0143] of JP-A-2008-195018. The coating amount (solid content) of the image-recording layer formed on a support after coating and drying may be varied according to the intended purpose but is in general preferably from 0.3 to 3.0 g/m$^2$. In the range described above, good sensitivity and good film property of the image-recording layer can be achieved.

(Undercoat Layer)

In the lithographic printing plate precursor according to the invention, an undercoat layer (also referred to as an intermediate layer) is preferably provided between the image-recording layer and the support. The undercoat layer strengthens adhesion between the support and the image-recording layer in the exposed area and makes removal of the image-recording layer from the support in the unexposed area easy, thereby contributing improvement in the developing property without accompanying degradation of the printing durability. Further, it is advantageous that in the case of infrared laser exposure, since the undercoat layer acts as a heat insulating layer, decrease in sensitivity due to diffusion of heat generated upon the exposure into the support is prevented.

As a compound for use in the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified. A polymer resin having an adsorbing group capable of adsorbing to a surface of the support, a hydrophilic group and a crosslinkable group as described in JP-A-2005-125749 and JP-A-2006-188038 is more preferably exemplified. The polymer resin is preferably a copolymer of a monomer having an adsorbing group, a monomer having a hydrophilic group and a monomer having a crosslinkable group. More specifically, a polymer resin which is a copolymer of a monomer having an adsorbing group, for example, a phenolic hydroxy group, a carboxyl group, —PO$_3$H$_2$, —OPO$_3$H$_2$, —CONHSO$_2$—, —SO$_2$NHSO$_2$— and —COCH$_2$COCH$_3$, a monomer having a hydrophilic sulfo group and a monomer having a polymerizable crosslinkable group, for example, a methacryl group or an allyl group. The polymer resin may contain a crosslinkable group introduced by a salt formation between a polar substituent of the polymer resin and a compound containing a substituent having a counter charge to the polar substituent of the polymer resin and an ethylenically unsaturated bond and also may be further copolymerized with a monomer other than those described above, preferably a hydrophilic monomer.

The content of the unsaturated double bond in the polymer resin for undercoat layer is preferably from 0.1 to 10.0 mmol, most preferably from 2.0 to 5.5 mmol, based on 1 g of the polymer resin.

The weight average molecular weight of the polymer resin for undercoat layer is preferably 5,000 or more, more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with the surface of aluminum support (for example, 1,4-diazobicyclo[2,2,2]octane (DABCO), 2,3,5,6-tetrahydroxy-p-quinone, chloranil, sulfophthalic acid, hydroxyethylenediaminetriacetic acid, dihydroxyethylenediaminediacetic acid or hydroxyethyliminodiacetic acid) in addition to the compounds for the undercoat layer described above in order to prevent the occurrence of stain due to preservation of the lithographic printing plate precursor.

The undercoat layer is coated according to a known method. The coating amount (solid content) of the undercoat layer is preferably from 0.1 to 100 mg/m$^2$, and more preferably from 1 to 30 mg/m$^2$.

(Support)

As the support for use in the lithographic printing plate precursor according to the invention, a known support is used. Particularly, an aluminum plate subjected to roughening treatment and anodizing treatment according to a known method is preferable.

Also, other treatments, for example, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness of 0.10 to 1.2 μm.

The support may have a backcoat layer containing an organic polymer compound described in JP-A-5-45885 or an alkoxy compound of silicon described in JP-A-5-45885, provided on the back surface thereof, if desired.

(Protective Layer)

In the lithographic printing plate precursor according to the invention, it is preferred to provide a protective layer (overcoat layer) on the image-recording layer. The protective layer has a function for preventing, for example, occurrence of scratch in the image-recording layer or ablation caused by exposure with a high illuminance laser beam, in addition to the function for restraining an inhibition reaction against the image formation by means of oxygen blocking.

With respect to the protective layer having such properties, there are described, for example, in U.S. Pat. No. 3,458,311 and JP-B-55-49729 (the term "JP-B" as used herein means an "examined Japanese patent publication"). As a polymer having low oxygen permeability for use in the protective layer, any water-soluble polymer and water-insoluble polymer can be appropriately selected to use. Specifically, for example, polyvinyl alcohol, a modified polyvinyl alcohol, polyvinyl pyrrolidone, a water-soluble cellulose derivative and poly (meth)acrylonitrile are exemplified.

It is also preferred that the protective layer contains an inorganic stratiform compound, for example, natural mica or synthetic mica as described in JP-A-2005-119273 in order to increase the oxygen blocking property.

Further, the protective layer may contain a known additive, for example, a plasticizer for imparting flexibility, a surfactant for improving a coating property or a fine inorganic particle for controlling a surface slipping property. The oil-sensitizing agent described with respect to the image-recording layer may also be incorporated into the protective layer.

The protective layer is coated according to a known method. The coating amount of the protective layer is preferably in a range of 0.01 to 10 $g/m^2$, more preferably in a range of 0.02 to 3 $g/m^2$, most preferably in a range of 0.02 to 1 $g/m^2$, in terms of the coating amount after drying.

[Plate Making Method]

Plate making of the lithographic printing plate precursor according to the invention is preferably performed by an on-press development method. The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the lithographic printing plate precursor is removed in the course of the printing step. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing step. Then, the printing operation is initiated using the printing machine with supplying oily ink and an aqueous component and at an early stage of the printing the on-press development is carried out. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

The on-press development method is described in more detail below.

As the light source used for the image exposure in the invention, a laser is preferable. The laser for use in the invention is not particularly restricted and includes, for example, a solid laser or semiconductor laser emitting an infrared ray having a wavelength of 760 to 1,200 nm.

With respect to the infrared ray laser, the output is preferably 100 mW or more, the exposure time per pixel is preferably within 20 microseconds, and the irradiation energy is preferably from 10 to 300 $mJ/cm^2$. With respect to the laser exposure, in order to shorten the exposure time, it is preferred to use a multibeam laser device.

The exposed lithographic printing plate precursor is mounted on a plate cylinder of a printing machine. In case of using a printing machine equipped with a laser exposure apparatus, the lithographic printing plate precursor is mounted on a plate cylinder of the printing machine and then subjected to the imagewise exposure.

When dampening water and printing ink are supplied to the imagewise exposed lithographic printing plate precursor to perform printing, in the exposed area of the image-recording layer, the image-recording layer cured by the exposure forms the printing ink receptive area having the oleophilic surface. On the other hand, in the unexposed area, the uncured image-recording layer is removed by dissolution or dispersion with the dampening water and/or printing ink supplied to reveal the hydrophilic surface in the area. As a result, the dampening water adheres on the revealed hydrophilic surface and the printing ink adheres to the exposed area of the image-recording layer, whereby printing is initiated.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor according to the invention is subjected to the on-press development on an offset printing machine and used as it is for printing a large number of sheets.

EXAMPLES

The present invention will be described in more detail with reference to the following examples, but the invention should not be construed as being limited thereto.

Examples 1 to 55 and Comparative Examples 1 to 3

1. Preparation of Lithographic Printing Plate Precursors (1) to (37), (44) and (47) to (58)

(1) Preparation of Support

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 $g/cm^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 $g/m^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 $A/dm^2$ in terms of the peak value of the electric current, and 5% of the electric current flowing from the electric source was divided to the auxiliary anode. The quantity of electricity in the nitric acid electrolysis was 175 $C/dm^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm² in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm² to form a direct current anodized film of 2.5 g/m², washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds. The adhesion amount of Si was 10 mg/m². Subsequently, the plate was washed with water to obtain Support (2). The center line average roughness (Ra) of the support was measured using a stylus having a diameter of 2 μm and found to be 0.51 μm.

(2) Formation of Undercoat Layer

Coating solution (1) for undercoat layer shown below was coated on Support (2) so as to have a dry coating amount of 20 mg/m² to prepare a support having an undercoat layer.

<Coating Solution (1) for Undercoat Layer>

| Compound (1) for undercoat layer having structure shown below | 0.18 g |
| --- | --- |
| Hydroxyethyliminodiacetic acid | 0.10 g |
| Methanol | 55.24 g |
| Water | 6.15 g |

Compound (1) for undercoat layer

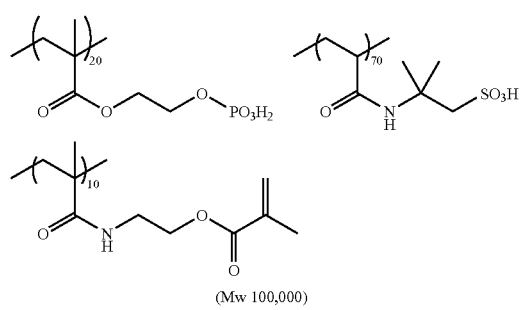

(Mw 100,000)

(3) Formation of Image-Recording Layer

Coating solution (1) for image-recording layer having the composition shown below was coated on the undercoat layer described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive Solution (1)>

| Binder polymer (1) having structure shown below | 0.240 g |
| --- | --- |
| Infrared absorbing agent (1) having structure shown below | 0.030 g |
| Photo-initiator shown in Table 1 | 0.162 g |
| Radical polymerizable compound (Tris(acryloyloxyethyl) isocyanurate (NK Ester A-9300, produced by Shin-Nakamura Chemical Co., Ltd.)) | 0.192 g |
| Compound represented by formula (1) or (2) shown in Table 1 | 0.090 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium PF₆ salt | 0.018 g |
| Oil-sensitizing agent (Ammonium group-containing polymer having structure shown below (reduced specific viscosity: 44 cSt/g/ml) | 0.035 g |
| Fluorine-based surfactant (1) having structure shown below | 0.008 g |
| Methyl ethyl ketone | 1.091 g |
| 1-Methoxy-2-propanol | 8.609 g |

<Microgel Solution (1)>

| Microgel (1) shown below | 2.640 g |
| --- | --- |
| Distilled water | 2.425 g |

The structures of Binder polymer (1), Infrared absorbing agent (1), Phosphonium compound (1), Hydrophilic low molecular weight compound (1), Oil-sensitizing agent (ammonium group-containing polymer) and Fluorine-based surfactant (1) are shown below.

Binder polymer (1)

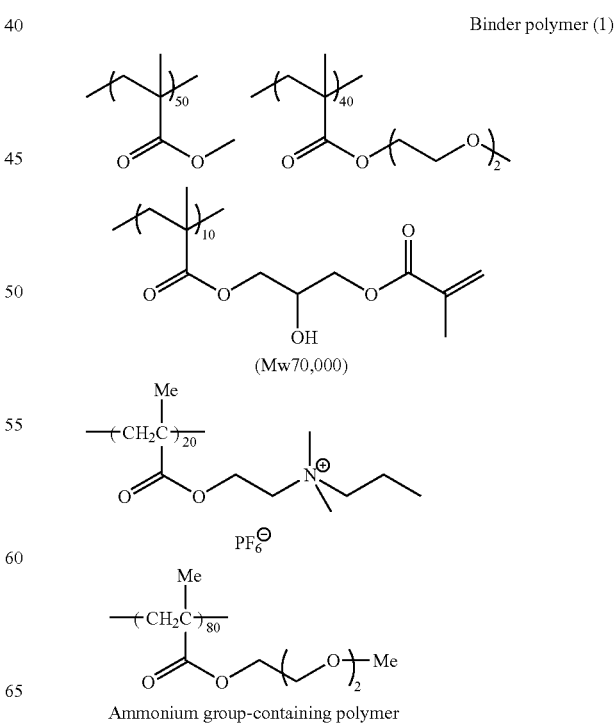

Ammonium group-containing polymer

-continued

Infrared absorbing agent (1)

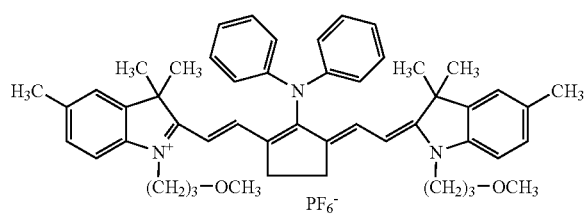

Fluorine-based surfactant (1)

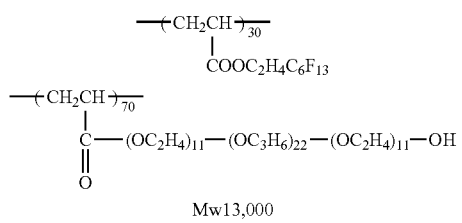

Mw13,000

Phosphonium compound (1)

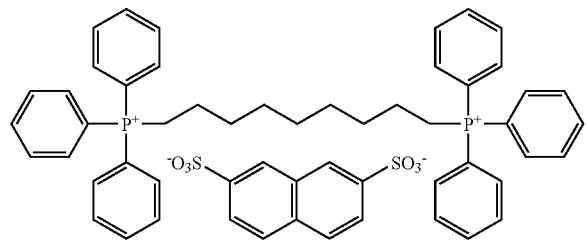

Hydrophilic low molecular weight compound (1)

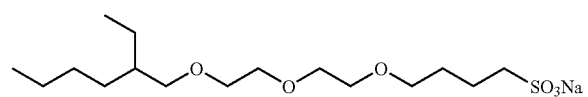

<Preparation of Microgel (1)>

An oil phase component was prepared by dissolving 10 g of adduct of trimethylol propane and xylene diisocyanate (Takenate D-110N, produced by Mitsui Chemicals Polyurethanes, Inc.), 3.15 g of pentaerythritol triacrylate (SR444, produced by Nippon Kayaku Co., Ltd.) and 0.1 g of Pionin A-41C (produced by Takemoto Oil & Fat Co., Ltd.) in 17 g of ethyl acetate. As an aqueous phase component, 40 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (1). The average particle size of Microgel (1) was measured by a light scattering method and found to be 0.2 μm.

(4) Formation of Protective Layer

Coating solution (1) for protective layer having the composition shown below was coated on the image-recording layer described above by a bar and dried in an oven at 120° C. for 60 seconds to form a protective layer having a dry coating amount of 0.15 g/m², thereby preparing Lithographic printing plate precursors (1) to (37) for Examples 1 to 37, Lithographic printing plate precursor (44) for Comparative Example 1 and Lithographic printing plate precursors (47) to (58) for Examples 44 to 55, respectively.

<Coating Solution (1) for Protective Layer>

| | |
|---|---|
| Dispersion of inorganic stratiform compound (1) shown below | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (Emalex 710, produced by Nihon Emulsion Co., Ltd.) | 0.86 g |
| Ion-exchanged water | 6.0 g |

<Preparation of Dispersion of Inorganic Stratiform Compound (1)>

To 193.6 g of ion-exchanged water was added 6.4 g of synthetic mica (Somasif ME-100, produced by CO—OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

2. Preparation of Lithographic Printing Plate Precursors (38) to (40) and (45)

Coating solution (2) for image-recording layer having the composition shown below was coated on the support provided with the undercoat layer described above by a bar and dried in an oven at 70° C. for 60 seconds to form an image-recording layer having a dry coating amount of 0.6 g/m², thereby preparing Lithographic printing plate precursors (38) to (40) for Examples 38 to 40 and Lithographic printing plate precursor (45) for Comparative Example 2, respectively.

<Coating Solution (2) for Image-Recording Layer>

| | |
|---|---|
| Aqueous dispersion of fine polymer particle (1) shown below | 33.0 g |
| Infrared absorbing agent (2) having structure shown below | 1.0 g |
| Photo-initiator (Irgacure 250, produced by Ciba Specialty Chemicals, Inc.) | 0.5 g |
| Compound represented by formula (1) or (2) shown in Table 1 | 1.0 g |
| Radical polymerizable compound (SR-399, produced by Sartomer Co.) | 1.50 g |
| Mercapto-3-triazole | 0.2 g |
| BYK 336 (produced by BYK-Chemie GmbH) | 0.4 g |
| Klucel M (produced by Hercules Chemical Co., Inc.) | 4.8 g |
| Elvacite 4026 (produced by Ineos Acrylics Inc.) | 2.5 g |
| n-Propanol | 55.0 g |
| Methyl ethyl ketone | 17.0 g |

The compounds indicated using their trade names in the composition above are shown below.

Irgacure 250:
(4-Methoxyphenyl) [4-(2-methylpropyl)phenyl]iodonium hexafluorophosphate (75% by weight propylene carbonate solution)
SR-399: Dipentaerythritol pentaacrylate
BYK 336: Modified dimethylpolysiloxane copolymer (25% by weight xylene/methoxypropyl acetate solution)
Klucel M: Hydroxypropyl cellulose (2% by weight aqueous solution)
Elvacite 4026: Highly branched polymethyl methacrylate (10% by weight 2-butanone solution)

3. Preparation of Lithographic Printing Plate Precursors (41) to (43) and (46)

Coating solution (3) for image-recording layer having the composition shown below was coated on the support provided with the undercoat layer described above by a bar and dried in an oven at 70° C. for 60 seconds to form an image-recording layer having a dry coating amount of 0.6 g/m², thereby preparing Lithographic printing plate precursors (41) to (43) for Examples 41 to 43 and Lithographic printing plate precursor (46) for Comparative Example 3, respectively.

(2)

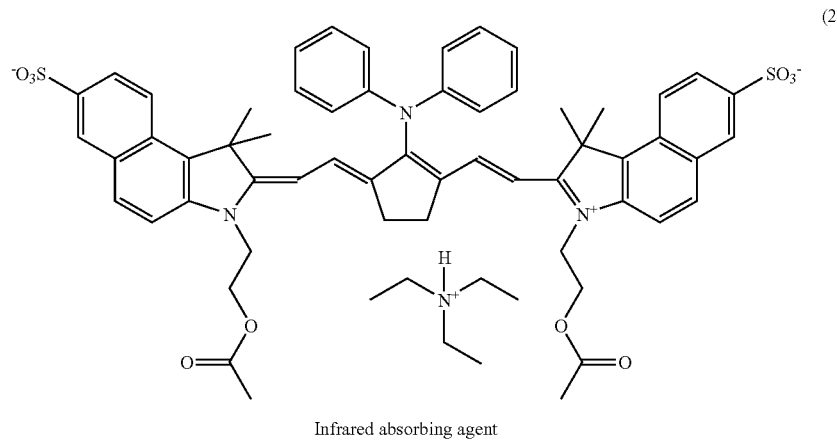

Infrared absorbing agent (Preparation of Aqueous Dispersion of Fine Polymer Particle (1))

A stirrer, a thermometer, a dropping funnel, a nitrogen inlet tube and a reflux condenser were attached to a 1,000 ml four-neck flask and while carrying out deoxygenation by introduction of nitrogen gas, 20 g of polyethylene glycol methyl ether methacrylate (PEGMA), 200 g of distilled water and 200 g of n-propanol were charged therein and heated until the internal temperature reached 70° C. Then, a mixture of 10 g of styrene (St), 80 g of acrylonitrile (AN) and 0.8 g of 2,2'-azobisisobutyronitrile previously prepared was dropwise added to the flask over a period of one hour. After the completion of the dropwise addition, the reaction was continued as it was for 5 hours. Then, 0.4 g of 2,2'-azobisisobutyronitrile was added and the internal temperature was raised to 80° C. Thereafter, 0.5 g of 2,2'-azobisisobutyronitrile was added over a period of 6 hours. At the stage after reacting for 20 hours in total, the polymerization proceeded 98% or more to obtain Aqueous dispersion of fine polymer particle (1) of PEGMA/St/AN (20/10/80 in a weight ratio). The particle size distribution of the fine particle polymer had the maximum value at the particle size of 150 nm.

The particle size distribution was determined by taking an electron microphotograph of the fine polymer particle, measuring particle sizes of 5,000 fine particles in total on the photograph, and dividing a range from the largest value of the particle size measured to 0 on a logarithmic scale into 50 parts to obtain occurrence frequency of each particle size by plotting. With respect to the aspherical particle, a particle size of a spherical particle having a particle area equivalent to the particle area of the aspherical particle on the photograph was defined as the particle size.

<Coating Solution (3) for Image-Recording Layer>

| | |
|---|---|
| Aqueous dispersion of fine polymer particle (2) | 33.0 g |
| Compound represented by formula (1) or (2) shown in Table 1 | 0.4 g |
| Polyacrylic acid (weight average molecular weight: 20,000) | 0.4 g |
| Infrared absorbing agent (3) having structure shown below | 1.0 g |
| Disodium 1,5-naphthalenedisulfonate | 0.1 g |
| Methanol | 16.0 g |

Infrared absorbing agent (3)

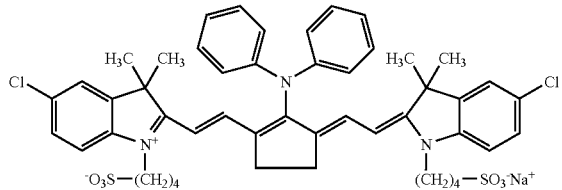

(Preparation of Aqueous Dispersion of Fine Polymer Particle (2))

A stirrer, a thermometer, a dropping funnel, a nitrogen inlet tube and a reflux condenser were attached to a 1,000 ml four-neck flask and while carrying out deoxygenation by introduction of nitrogen gas, 350 ml of distilled water was charged therein and heated until the internal temperature reached 80° C. To the flask was added 1.5 g of sodium dodecylsufate as a dispersing agent, then was added 0.45 g of ammonium persulfate as an initiator, and thereafter was dropwise added 45.0 g of styrene through the dropping funnel over a period of about one hour. After the completion of the dropwise addition, the mixture was continued to react as it was for 5 hours, followed by removing the unreacted monomers by steam distillation. The mixture was cooled, adjusted the pH to 6 with aqueous ammonia and finally added pure water thereto so as to have the nonvolatile content of 15% by weight to obtain Aqueous dispersion of fine polymer particle (2). The particle size distribution of the fine polymer particle measured in the same manner as in Aqueous dispersion of fine polymer particle (1) had the maximum value at the particle size of 60 nm.

4. Evaluation of Lithographic Printing Plate Precursor (1) Plate Inspection Property Each of Lithographic printing plate precursors (1) to (58) thus-obtained was exposed by Trendsetter 3244VX (produced by Creo Co.) equipped with a water-cooled 40 W infrared semiconductor laser under the conditions of output of 11.7 W, a rotational number of an outer surface drum of 250 rpm and resolution of 2,400 dpi. The exposed lithographic printing plate precursor was allowed to stand for 30 minutes in a dark place having atmosphere at 25° C. and relative humidity of 50% RH and then the plate inspection property was evaluated. Ease of plate inspection was measured using an L value (luminance) of L*a*b* color system and difference (ΔL) between an L value of the exposed area and an L value of the unexposed area is determined. As the value of ΔL is large, the plate inspection property is more excellent. The measurement was conducted according to SCE (specular competent exclude) system using a spectral colorimeter CM2600d and an operation soft CM-S100 W each produced by KONICA MINOLTA Inc. According to the SCE system, since the specular light is excluded and only the diffusion light is measured, evaluation of color close to evaluation with visual observation is conducted and the result well correlates with the practical human plate inspection. The results obtained are shown in Table 1.

(2) On-Press Development Property

Each of the lithographic printing plate precursors thus-obtained was exposed by Luxel Platesetter T-6000III equipped with an infrared semiconductor laser, produced by Fuji Film Co., Ltd. under the conditions of a rotational number of an outer surface drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (Lithrone 26, produced by Komori Corp.). Using dampening water (Ecolity-2 (produced by Fuji Film Co., Ltd.)/tap water=2/98 (volume ratio)) and Values-G (N) Black Ink (produced by Dainippon Ink & Chemicals, Inc.), the dampening water and ink were supplied according to the standard automatic printing start method of Lithrone 26 to conduct printing on 100 sheets of Tokubishi art paper (76.5 kg) at a printing speed of 10,000 sheets per hour.

A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Table 1.

(3) Printing Durability

After performing the evaluation for the on-press development property described above, the printing was continued. As the increase in a number of printing papers, the image-recording layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the $100^{th}$ paper of the printing was determined to evaluate the printing durability. The results obtained are shown in Table 1.

TABLE 1

| | | | | | Coating | Evaluation Result of Printing | | |
| | Lithographic Printing Plate Precursor | Coating Solution for Image-recording Layer | Compound Represented by Formula (1) or (2) | Photo-initiator | Solution for Protective Layer | Plate Inspection Property (ΔL) | Printing Durability (x $10^4$ sheets) | On-press Development Property (sheets) |
| --- | --- | --- | --- | --- | --- | --- | --- | --- |
| | | | Examples 1 to 37 | | | | | |
| Example 1 | (1) | (1) | A-1 | I-1 | (1) | 4.5 | 4 | 20 |
| Example 2 | (2) | (1) | A-3 | I-1 | (1) | 4.5 | 4 | 20 |
| Example 3 | (3) | (1) | A-5 | I-1 | (1) | 4.5 | 4 | 20 |
| Example 4 | (4) | (1) | A-6 | I-1 | (1) | 4.5 | 4 | 20 |
| Example 5 | (5) | (1) | A-7 | I-1 | (1) | 4.5 | 4 | 20 |
| Example 6 | (6) | (1) | A-8 | I-1 | (1) | 4.5 | 4 | 20 |
| Example 7 | (7) | (1) | A-9 | I-1 | (1) | 4.5 | 4 | 20 |
| Example 8 | (8) | (1) | A-10 | I-1 | (1) | 4.5 | 4 | 20 |
| Example 9 | (9) | (1) | A-11 | I-1 | (1) | 4.5 | 4 | 20 |
| Example 10 | (10) | (1) | A-12 | I-1 | (1) | 4.5 | 4 | 20 |
| Example 11 | (11) | (1) | A-13 | I-1 | (1) | 4.5 | 4 | 20 |
| Example 12 | (12) | (1) | A-14 | I-1 | (1) | 5.0 | 4 | 20 |
| Example 13 | (13) | (1) | A-15 | I-1 | (1) | 5.0 | 4 | 20 |
| Example 14 | (14) | (1) | A-16 | I-1 | (1) | 5.0 | 4 | 20 |
| Example 15 | (15) | (1) | A-17 | I-1 | (1) | 5.0 | 4 | 20 |
| Example 16 | (16) | (1) | A-18 | I-1 | (1) | 5.0 | 4 | 20 |
| Example 17 | (17) | (1) | A-19 | I-1 | (1) | 5.0 | 4 | 20 |
| Example 18 | (18) | (1) | A-20 | I-1 | (1) | 5.0 | 4 | 20 |
| Example 19 | (19) | (1) | A-21 | I-1 | (1) | 5.0 | 4 | 20 |
| Example 20 | (20) | (1) | A-22 | I-1 | (1) | 5.0 | 4 | 20 |
| Example 21 | (21) | (1) | A-23 | I-1 | (1) | 5.0 | 4 | 20 |

TABLE 1-continued

| | | | | | | | | |
|---|---|---|---|---|---|---|---|---|
| Example 22 | (22) | (1) | A-24 | I-1 | (1) | 5.0 | 4 | 20 |
| Example 23 | (23) | (1) | A-25 | I-1 | (1) | 5.0 | 4 | 20 |
| Example 24 | (24) | (1) | A-26 | I-1 | (1) | 5.0 | 4 | 20 |
| Example 25 | (25) | (1) | A-27 | I-1 | (1) | 5.0 | 4 | 20 |
| Example 26 | (26) | (1) | A-28 | I-1 | (1) | 5.0 | 4 | 20 |
| Example 27 | (27) | (1) | A-29 | I-1 | (1) | 5.0 | 4 | 20 |
| Example 28 | (28) | (1) | A-30 | I-1 | (1) | 5.0 | 4 | 20 |
| Example 29 | (29) | (1) | A-31 | I-1 | (1) | 5.0 | 4 | 20 |
| Example 30 | (30) | (1) | A-32 | I-1 | (1) | 5.0 | 4 | 20 |
| Example 31 | (31) | (1) | A-36 | I-1 | (1) | 5.0 | 4 | 20 |
| Example 32 | (32) | (1) | A-37 | I-1 | (1) | 5.0 | 4 | 20 |
| Example 33 | (33) | (1) | A-38 | I-1 | (1) | 5.0 | 4 | 20 |
| Example 34 | (34) | (1) | A-39 | I-1 | (1) | 5.0 | 4 | 20 |
| Example 35 | (35) | (1) | A-40 | I-1 | (1) | 4.5 | 4 | 20 |
| Example 36 | (36) | (1) | A-13 | I-2 | (1) | 4.5 | 4 | 20 |
| Example 37 | (37) | (1) | A-13 | I-3 | (1) | 4.5 | 4 | 20 |
| Examples 44 to 55 | | | | | | | | |
| Example 44 | (47) | (1) | A-45 | I-1 | (1) | 4.0 | 4 | 20 |
| Example 45 | (48) | (1) | A-46 | I-1 | (1) | 4.5 | 4 | 20 |
| Example 46 | (49) | (1) | A-49 | I-1 | (1) | 4.5 | 4 | 20 |
| Example 47 | (50) | (1) | A-52 | I-1 | (1) | 4.5 | 4 | 20 |
| Example 48 | (51) | (1) | A-53 | I-1 | (1) | 4.5 | 4 | 20 |
| Example 49 | (52) | (1) | A-55 | I-1 | (1) | 4.5 | 4 | 20 |
| Example 50 | (53) | (1) | A-58 | I-1 | (1) | 4.5 | 4 | 20 |
| Example 51 | (54) | (1) | A-61 | I-1 | (1) | 4.5 | 4 | 20 |
| Example 52 | (55) | (1) | A-66 | I-1 | (1) | 4.5 | 4 | 20 |
| Example 53 | (56) | (1) | A-67 | I-1 | (1) | 4.5 | 4 | 20 |
| Example 54 | (57) | (1) | A-68 | I-1 | (1) | 4.5 | 4 | 20 |
| Example 55 | (58) | (1) | A-69 | I-1 | (1) | 4.5 | 4 | 20 |
| Examples 38 to 43 and Comparative Examples 1 to 3 | | | | | | | | |
| Example 38 | (38) | (2) | A-13 | Irgacure 250 | None | 4.0 | 3 | 30 |
| Example 39 | (39) | (2) | A-14 | Irgacure 250 | None | 4.5 | 3 | 30 |
| Example 40 | (40) | (2) | A-16 | Irgacure 250 | None | 4.5 | 3 | 30 |
| Example 41 | (41) | (3) | A-13 | None | None | 4.0 | 3 | 30 |
| Example 42 | (42) | (3) | A-14 | None | None | 4.5 | 3 | 30 |
| Example 43 | (43) | (3) | A-16 | None | None | 4.5 | 3 | 30 |
| Comparative Example 1 | (44) | (1) | None | I-1 | (1) | 3.5 | 4 | 20 |
| Comparative Example 2 | (45) | (2) | None | Irgacure 250 | None | 3.0 | 3 | 20 |
| Comparative Example 3 | (46) | (3) | None | None | None | 3.0 | 3 | 20 |

In Table 1, the symbols in the columns of the compound represented by formula (1) or (2) indicate the numbers of the compounds in the specific examples described hereinbefore, respectively. The symbols in the columns of the photo-initiator indicate the compounds having the structure shown below, respectively.

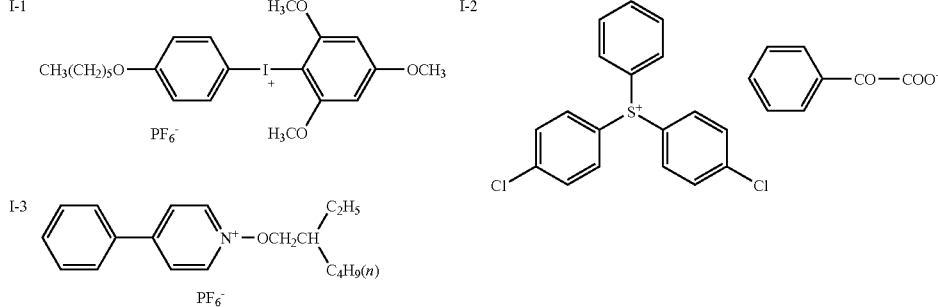

As is apparent from the results shown above, the improvement in visibility of print-out image after image exposure is achieved by using the compound represented by formula (1) or (2) according to the invention.

What is claimed is:

1. A lithographic printing plate precursor comprising an image-recording layer and a support, wherein the image-recording layer comprises: (A) at least one compound selected from compounds represented by the following formulae (1) and (2); and (B) an infrared absorbing agent:

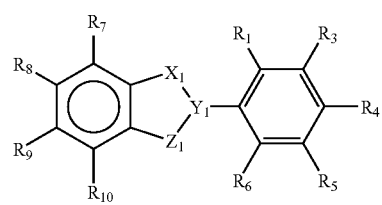

(1)

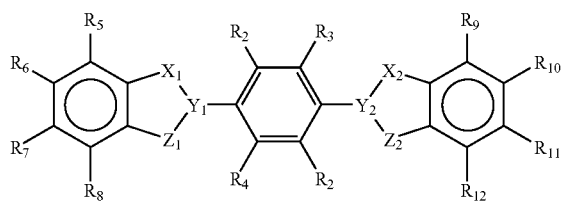
(2)

wherein $R_1$ and $R_2$ each represents $R_a$—$SO_3$—, $R_a$—$CO_2$— or $R_a$—$OCO_2$—, $R_a$ represents a monovalent organic group, $R_3$ to $R_{12}$ each represents a hydrogen atom or a monovalent substituent, or adjacent two of $R_3$ to $R_{12}$ may be combined with each other to form a ring, $X_1$, $Y_1$ and $Z_1$ and $X_2$, $Y_2$ and $Z_2$ each represents an atomic group necessary to form a thiazole ring, an oxazole ring, an imidazole ring, a triazole ring or a 3H-indole ring, provided that one nitrogen atom of the imidazole ring is connected to a hydrogen atom or a monovalent organic group.

2. The lithographic printing plate precursor as claimed in claim 1, wherein the image-recording layer comprises (C) a photo-initiator.

3. The lithographic printing plate precursor as claimed in claim 2, wherein the photo-initiator is an iodonium compound, a sulfonium compound or an azinium compound.

4. The lithographic printing plate precursor as claimed in claim 1, wherein the image-recording layer comprises (D) a radical polymerizable compound.

5. The lithographic printing plate precursor as claimed in claim 1, wherein the image-recording layer further comprises (E) a hydrophobilizing precursor.

6. The lithographic printing plate precursor as claimed in claim 1, which further comprises a protective layer, so that the support, the image-recording layer and the protective layer are provided in this order.

7. The lithographic printing plate precursor as claimed in claim 6, wherein the protective layer comprises an inorganic stratiform compound.

8. The lithographic printing plate precursor as claimed in claim 1, wherein the image-recording layer is capable of forming an image after image exposure by supplying printing ink and dampening water on a printing machine to remove an unexposed area of the image-recording layer.

9. A plate making method comprising:
exposing imagewise the lithographic printing plate precursor as claimed in claim 8 and mounting the exposed lithographic printing plate precursor on a printing machine or mounting the lithographic printing plate precursor as claimed in claim 8 on a printing machine and exposing imagewise the mounted lithographic printing plate precursor; and
conducting on-press development processing by supplying printing ink and dampening water to the exposed and mounted lithographic printing plate precursor.

10. A plate making method comprising:
exposing imagewise the lithographic printing plate precursor as claimed in claim 8 and mounting the exposed lithographic printing plate precursor on a printing machine or mounting the lithographic printing plate precursor as claimed in claim 8 on a printing machine and exposing imagewise the mounted lithographic printing plate precursor to form color in the exposed area; and
conducting on-press development processing by supplying printing ink and dampening water to the lithographic printing plate precursor having color in the exposed area.

* * * * *